(12) United States Patent
Kim et al.

(10) Patent No.: US 10,186,615 B2
(45) Date of Patent: Jan. 22, 2019

(54) SEMICONDUCTOR DEVICE

(71) Applicant: Samsung Electronics Co., Ltd., Hwaseong-si (KR)

(72) Inventors: Sung-Soo Kim, Seoul (KR); Gi-Gwan Park, Suwon-si (KR); Song-E Kim, Seoul (KR); Koung-Min Ryu, Hwaseong-si (KR); Sun-Ki Min, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/889,803

(22) Filed: Feb. 6, 2018

(65) Prior Publication Data

US 2018/0190821 A1 Jul. 5, 2018

Related U.S. Application Data

(63) Continuation of application No. 15/295,821, filed on Oct. 17, 2016, now abandoned.

(30) Foreign Application Priority Data

Nov. 3, 2015 (KR) .................. 10-2015-0153700

(51) Int. Cl.
*H01L 29/78* (2006.01)
*H01L 29/06* (2006.01)
*H01L 29/417* (2006.01)

(52) U.S. Cl.
CPC ...... *H01L 29/7855* (2013.01); *H01L 29/0657* (2013.01); *H01L 29/41791* (2013.01); *H01L 29/7843* (2013.01); *H01L 29/7846* (2013.01); *H01L 29/7853* (2013.01); *H01L 29/7854* (2013.01)

(58) Field of Classification Search
CPC .......... H01L 29/0657; H01L 29/41791; H01L 29/785; H01L 29/7851; H01L 29/7853–29/7858
See application file for complete search history.

(56) References Cited

U.S. PATENT DOCUMENTS

| 8,546,891 | B2 | 10/2013 | Chang et al. |
| 8,748,989 | B2 | 6/2014 | Lin et al. |
| 8,878,308 | B2 | 11/2014 | Chen et al. |
| 8,895,446 | B2 | 11/2014 | Peng et al. |

(Continued)

*Primary Examiner* — Daniel P Shook
(74) *Attorney, Agent, or Firm* — Muir Patent Law, PLLC

(57) ABSTRACT

A semiconductor device is provided which includes a first fin-type pattern including a first side surface and a second side surface opposite to each other, a first trench of a first depth adjacent to the first side surface, a second trench of a second depth adjacent to the second side surface. The second depth differs from the first depth, and a first field insulating film partially fills the first trench and a second field insulating film partially fills the second trench. The first fin-type pattern has a lower portion, and an upper portion having a narrower width than the lower portion, and has a first stepped portion on a boundary between the upper portion and the lower portion. The first field insulating film includes a first lower field insulating film in contact with the lower portion, and a first upper field insulating film in contact with the upper portion.

20 Claims, 16 Drawing Sheets

(56) References Cited

U.S. PATENT DOCUMENTS

| | | |
|---|---|---|
| 8,993,417 B2 | 3/2015 | Tsai et al. |
| 2004/0262676 A1 | 12/2004 | Lee et al. |
| 2008/0265338 A1 | 10/2008 | Yu et al. |
| 2014/0306317 A1 | 10/2014 | Licausi |
| 2014/0315371 A1 | 10/2014 | Cai et al. |
| 2014/0367798 A1 | 12/2014 | Kuo et al. |
| 2015/0054039 A1 | 2/2015 | Ching et al. |
| 2016/0315193 A1 | 10/2016 | Kim et al. |
| 2017/0092728 A1* | 3/2017 | Kim ................ H01L 29/41791 |

* cited by examiner

SEMICONDUCTOR DEVICE

CROSS-REFERENCE TO RELATED APPLICATION

This application is a continuation of and claims priority to U.S. patent application Ser. No. 15/295,821 filed on Oct. 17, 2016, which claims priority from Korean Patent Application No. 10-2015-0153700 filed on Nov. 3, 2015 in the Korean Intellectual Property Office, and all the benefits accruing therefrom under 35 U.S.C. 119, the contents of each of which being incorporated by reference herein.

BACKGROUND

1. Technical Field

The present disclosure relates to a semiconductor device.

2. Description of the Related Art

Multigate transistors in which a silicon body in a fin or nanowire shape is formed on a substrate, with a gate then being formed on a surface of the silicon body have been used to increase the density of semiconductor devices.

Such multigate transistors allow for easy scaling, as they use a three-dimensional channel. Further, current control capability can be enhanced without requiring increased gate length in multigate transistors. Furthermore, it is possible to effectively suppress the short channel effect (SCE), the phenomenon in which the electric potential of the channel region is influenced by the drain voltage.

SUMMARY

A technical object of an exemplary implementation of the subject matter described herein is to provide a semiconductor device in which positions of fin-type patterns can be adjusted using the depth and width of trenches between the fin-type patterns.

The objectives that are intended to be addressed by the present disclosure are not limited to that mentioned above, and other objectives that are not mentioned above can be clearly understood to those skilled in the art based on the description provided below.

According to an exemplary implementation, there is provided a semiconductor device, comprising a first fin-type pattern comprising a first side surface and a second side surface opposed to each other, a first trench of a first depth in contact with the first side surface, a second trench of a second depth in contact with the second side surface, wherein the second depth is different from the first depth, a first field insulating film partially filling the first trench and a second field insulating film partially filling the second trench, wherein the first fin-type pattern comprises a lower portion, and an upper portion having a narrower width than the lower portion, and has a first stepped portion on a boundary between the upper portion and the lower portion, and the first field insulating film comprises a first lower field insulating film in contact with the lower portion, and a first upper field insulating film in contact with the upper portion.

According to another exemplary implementation, there is provided a semiconductor device, comprising a first fin-type pattern protruding from a substrate and comprising a first side surface and a second side surface opposed to each other, wherein a distance between the substrate and an upper surface of the first fin-type pattern is a first distance, a second fin-type pattern protruding from the substrate and comprising a third side surface and a fourth side surface opposed to each other, wherein a distance between the substrate and an upper surface of the second fin-type pattern is a second distance, a first trench being in contact with the first side surface and having a first width and a first depth and a second trench being in contact with the second side surface and the third side surface between the first fin-type pattern and the second fin-type pattern, and having a second width and a second depth, wherein at least one of the first width or the second width, and at least one of the first depth or the second depth are different from each other.

According to still another exemplary implementation, there is provided a semiconductor device, comprising a first fin-type pattern comprising a first side surface and a second side surface opposed to each other, a second fin-type pattern comprising a third side surface and a fourth side surface opposed to each other, and being inclined toward the third side surface, a first trench being in contact with the first side surface and having a first width and a first depth, a second trench being in contact with the second side surface and the third side surface, respectively, between the first fin-type pattern and the second fin-type pattern, and having a second width and a second depth, a third trench being in contact with the fourth side surface and having a third width and a third depth, a first field insulating film partially filling the first trench, a second field insulating layer partially filling the second trench and a third field insulating film partially filling the third trench, wherein the second field insulating film comprises a second lower field insulating film and a second upper field insulating film formed on the second lower field insulating film.

According to further still another exemplary implementation, there is provided a semiconductor device, comprising a substrate, a first fin-type pattern being formed on the substrate, comprising a first side surface and a second side surface opposed to each other, and being inclined to a first direction with reference to an upper surface direction of the substrate, a second fin-type pattern being formed on the substrate, comprising a third side surface and a fourth side surface opposed to each other, and being inclined to a direction opposite to the first direction with reference to the upper surface direction of the substrate, a first trench being in contact with the first side surface, a second trench being in contact with the second side surface and the third side surface, respectively and a third trench being in contact with the fourth side surface, wherein depths of the first to the third trenches are different from one another.

According to further still another exemplary implementation, there is provided a semiconductor device, comprising a first to a third fin-type patterns each comprising a lower portion, and an upper portion of a narrower width than the lower portion, and each having a stepped portion on a boundary between the upper portion and the lower portion, a first trench formed between the first fin-type pattern and the second fin-type pattern, a first trench formed between the second fin-type pattern and the third fin-type pattern, a lower field insulating layer being formed within the first trench and the second trench, and being in contact with lower portions of the first to the third fin-type patterns and an upper field insulating film being formed within the first trench and the second trench, and being in contact with portions of the upper portions of the first to the third fin-type patterns, wherein a distance between the lower portion of the first fin-type pattern and the lower portion of the second fin-type pattern, and a distance between the lower portion of the second fin-type pattern and the lower portion of the third fin-type pattern are same as each other, a distance between the upper portion of the first fin-type pattern and the upper portion of the second fin-type pattern, and a distance between the upper portion of the second fin-type pattern and the upper portion of the third fin-type pattern are different from each other, and depths of the first trench and the third trench are different from each other.

BRIEF DESCRIPTION OF THE DRAWINGS

The above and other objects, features and advantages of the present disclosure will become more apparent to those of ordinary skill in the art by describing in detail exemplary implementations thereof with reference to the accompanying drawings, in which.

DETAILED DESCRIPTION

Figure 1:
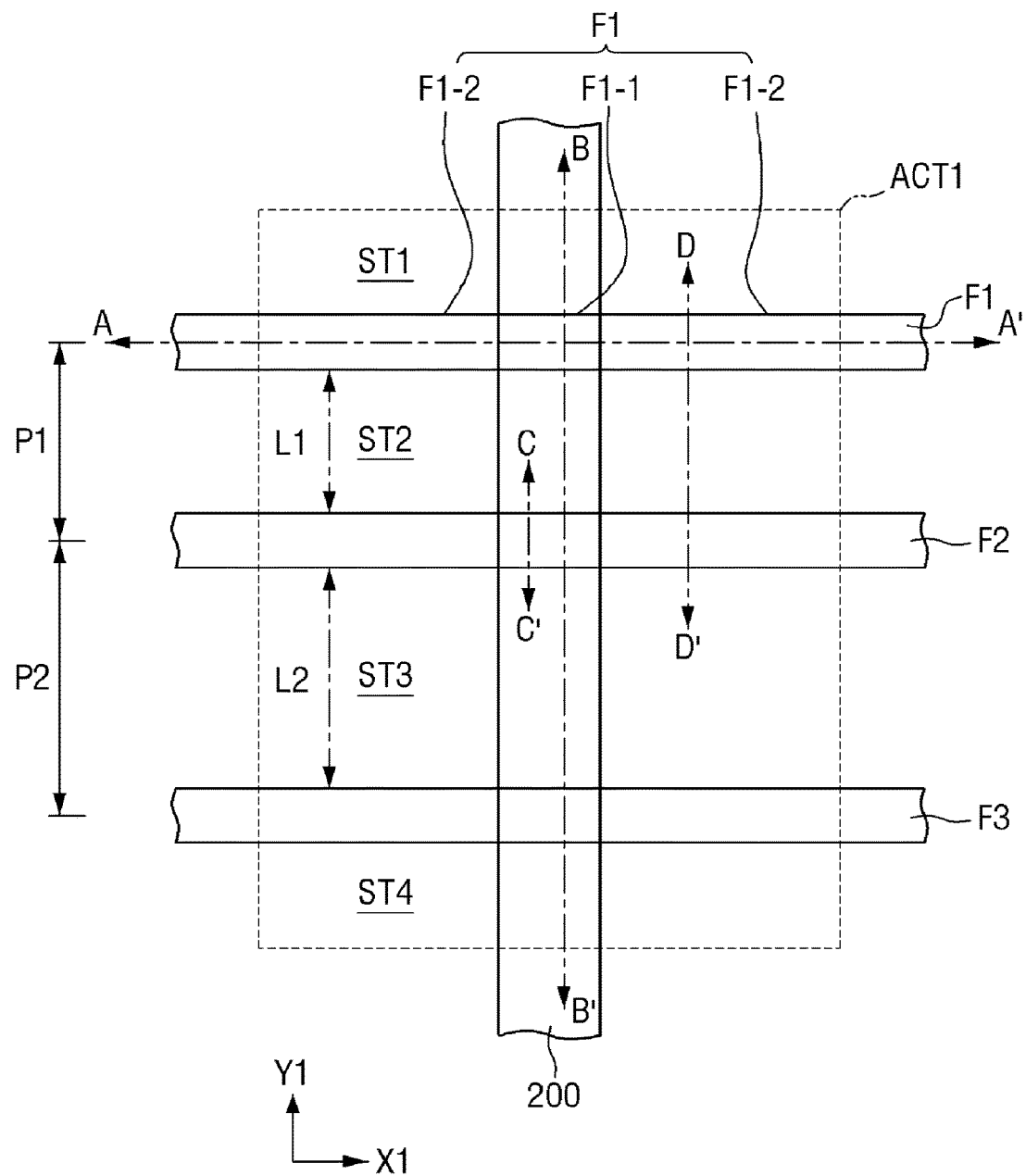
FIG. 1 is a layout diagram provided to explain a semiconductor device according to some exemplary implementations.

The present exemplary implementations of the disclosed subject matter herein will now be described more fully hereinafter with reference to the accompanying drawings. This invention may, however, be embodied in different forms and should not be construed as limited to the exemplary implementations set forth herein. Rather, these exemplary implementations are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to," or "on" another element or layer, it can be directly connected to or coupled to or on another element or layer or intervening elements or layers may be present. In contrast, when an element is referred to as being "directly connected to" or "directly coupled to" or "directly on" another element or layer, there are no intervening elements or layers present. The term "contact," "contacting," or "in contact with," however, refers to a direct connecting (i.e., touching), unless the context indicates otherwise. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. Unless the context indicates otherwise, these terms are only used to distinguish one element from another element. Thus, for example, a first element, a first component or a first section discussed below in one section of the specification could be termed a second element, a second component or a second section in another section of the specification without departing from the teachings of the present inventive concept. In addition, in certain cases, even if a term is not described using "first," "second," etc., in the specification, it may still be referred to as "first" or "second" in a claim in order to distinguish different claimed elements from each other.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinbelow, a semiconductor device according to an exemplary implementation will be explained with reference to FIGS. 1 to 5.

Figure 2:
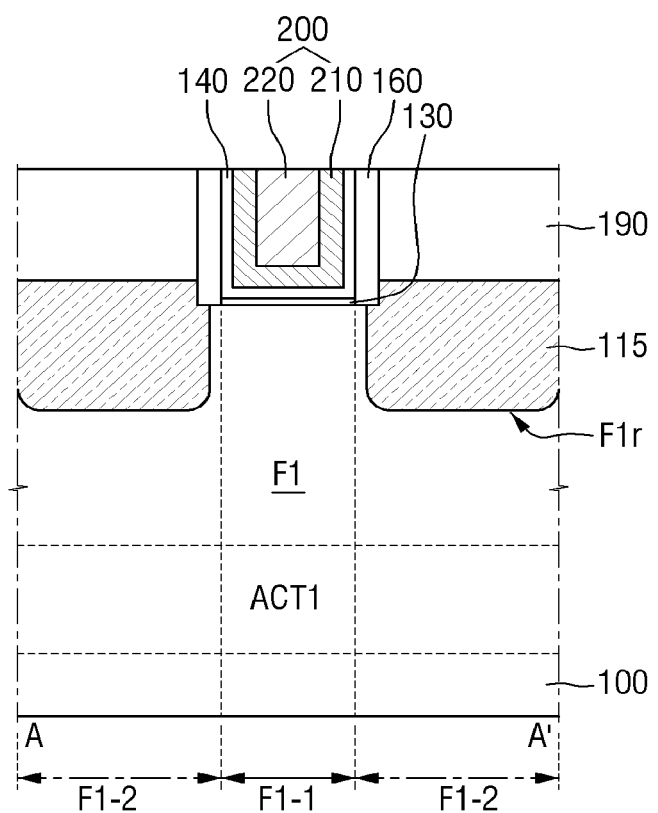
FIG. 2 is a cross sectional view taken on line A-A' of FIG. 1.
Figure 3:
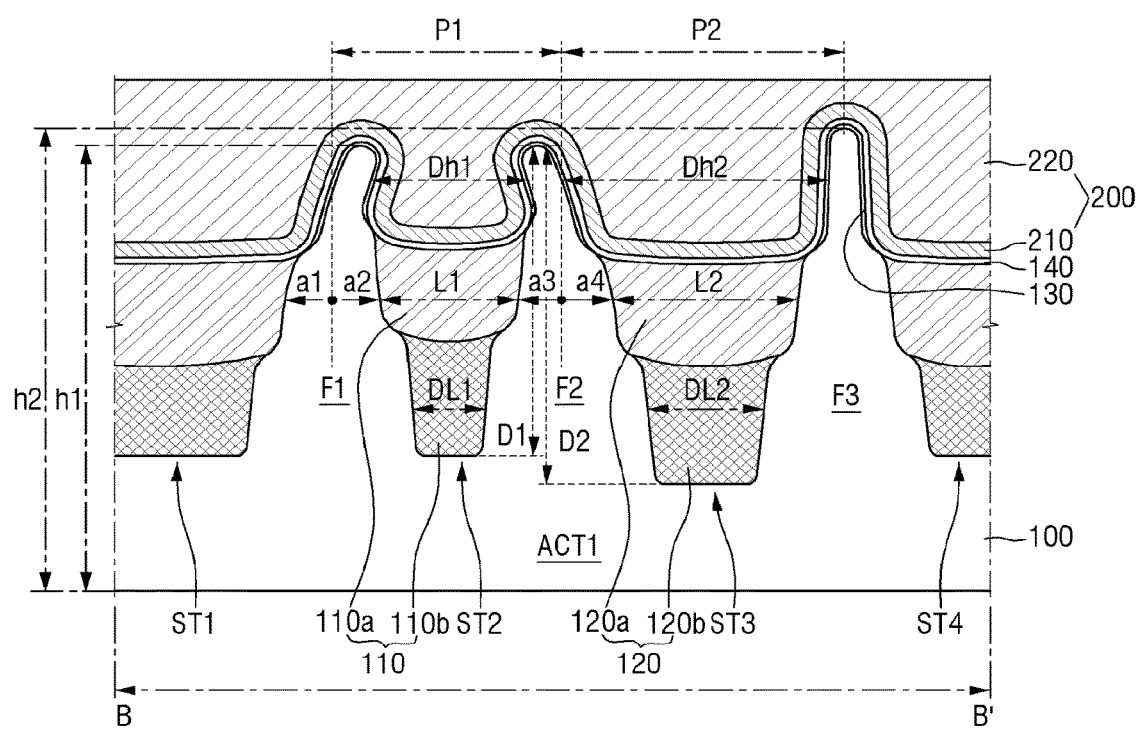
FIG. 3 is a cross sectional view taken on line B-B' of FIG. 1.
Figure 4:
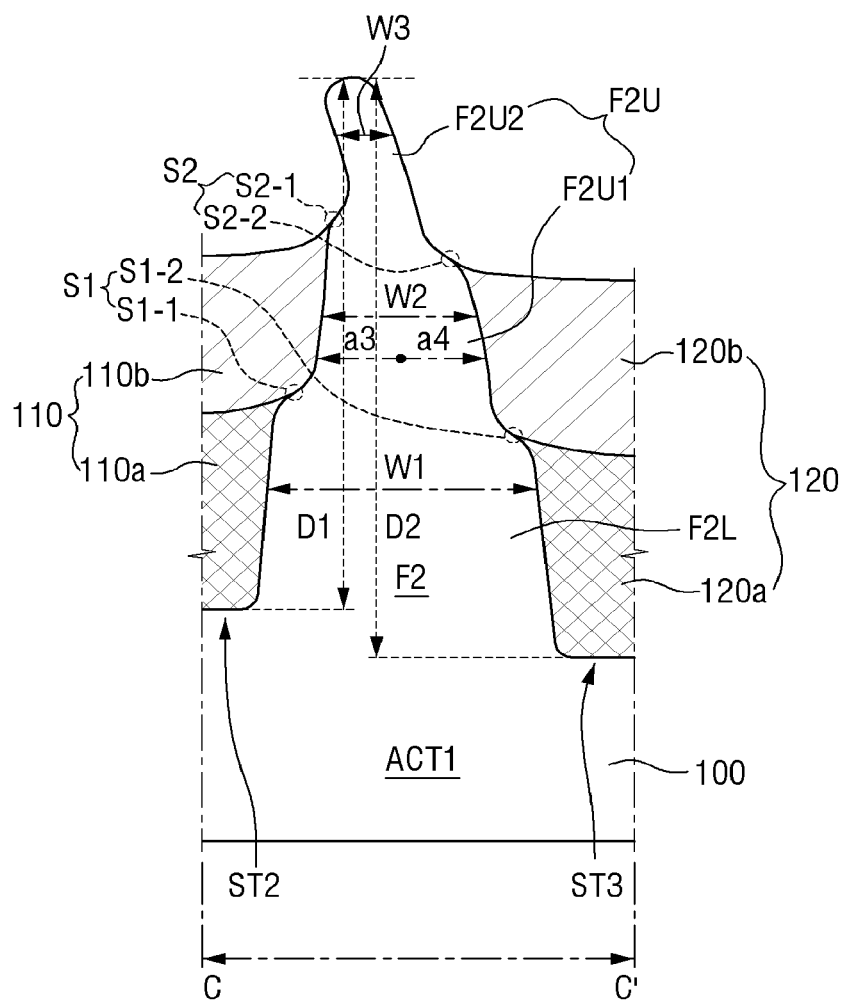
FIG. 4 is a cross sectional view taken on line C-C' of FIG. 1.
Figure 5:
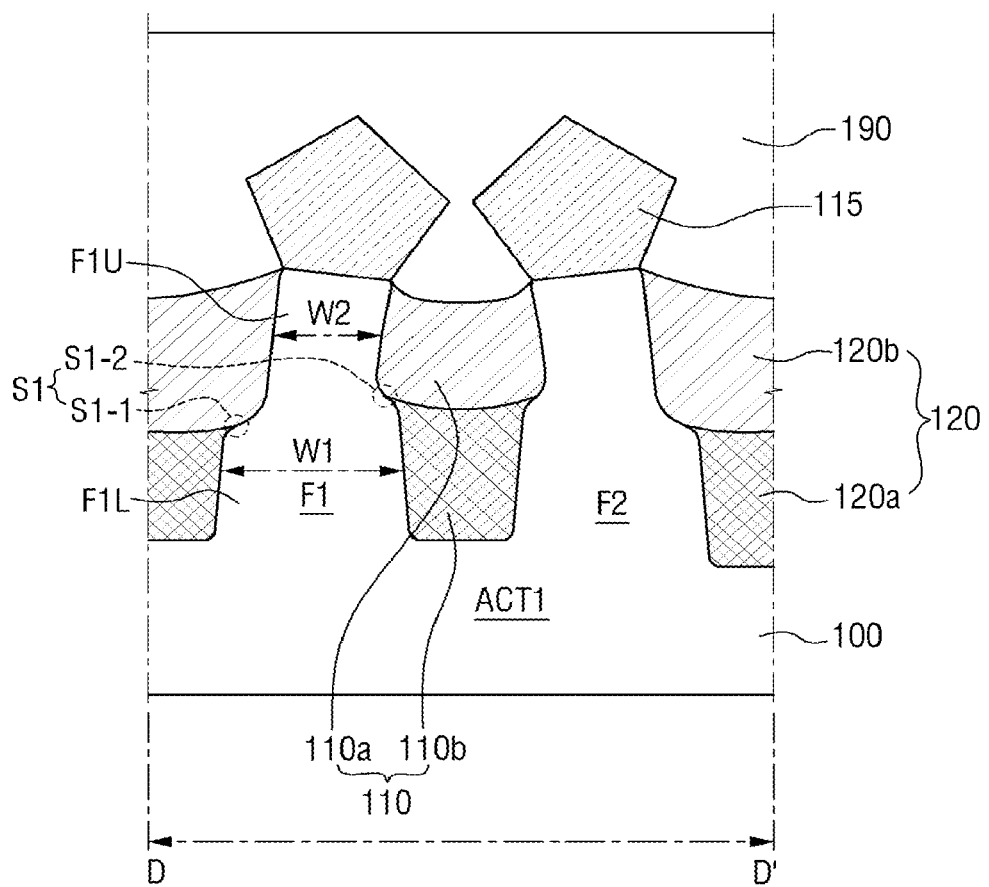
FIG. 5 is a cross sectional view taken on line D-D' of FIG. 1.

FIG. 1 is a layout diagram provided to explain a semiconductor device according to some exemplary implementations, and FIG. 2 is a cross sectional view taken on line A-A' of FIG. 1. FIG. 3 is a cross sectional view taken on line B-B' of FIG. 1, and FIG. 4 is a cross sectional view taken on line C-C' of FIG. 1. FIG. 5 is a cross sectional view taken on line D-D' of FIG. 1. For convenience of explanation, FIG. 4 skips illustration of gate insulating films 130, 140 and a gate electrode 200.

As shown in FIGS. 1 to 5, a semiconductor device according to an exemplary implementation may include a substrate 100, a first to a third fin-type patterns F1-F3, a first to a fourth shallow trenches ST1-ST4, a first field insulating film 110, a second field insulating film 120, a gate electrode 200, gate insulating films 130, 140, a gate spacer 160, a source/drain 115, and so on.

The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

As shown in FIG. 1, the first to the third fin-type patterns F1-F3 may extend longitudinally in a first direction X1. As illustrated in FIG. 1, the first to the third fin-type patterns F1-F3 may have a rectangular shape, although exemplary embodiments are not limited thereto. If the first to the third fin-type patterns F1-F3 are in rectangular shape, the first to the third fin-type patterns F1-F3 may include long sides extending in the first direction X1 and short sides extending in a second direction Y1. The second direction Y1 may be the direction that is not parallel to, but intersects the first direction X1.

The first to the third fin-type patterns F1-F3 may be spaced apart from one another in the second direction Y1. In this case, the first fin-type pattern F1 and the second fin-type pattern F2 may be spaced apart from each other by a first pitch P1. The second fin-type pattern F2 and the third fin-type pattern F3 may be spaced by a second pitch P2. In this case, the first pitch P1 may be smaller than the second pitch P2. Note that the above-mentioned configurations are given only for exemplary purpose, and whether the first pitch P1 is larger (or smaller) than the second pitch P2, or vice versa may vary.

The first to the third fin-type patterns F1-F3 may be defined by the first to the fourth shallow trenches ST1-ST4. Specifically, the first fin-type pattern F1 and the second fin-type pattern F2 may be spaced apart from each other by the second shallow trench ST2. The second fin-type pattern F2 and the third fin-type pattern F3 may be spaced apart from each other by the third shallow trench ST3. The second shallow trench ST2 may be formed on a side surface of the first fin-type pattern F1 which is opposed to (e.g., which side surface faces) the second fin-type pattern F2. The first shallow trench ST1 may be formed on a side surface of the first fin-type pattern F1 which is not opposed to (e.g., which side surface faces away from) the second shallow trench ST2. The third shallow trench ST3 may be formed on a side surface of the third fin-type pattern F3 which is opposed to (e.g., which side surface faces) the second fin-type pattern F2. The fourth shallow trench ST4 may be formed on a side surface of the third fin-type pattern F3 which is not opposed to (e.g., which side surface faces away from) the second shallow trench ST2.

The first to the third fin-type patterns F1-F3 may be those that are formed by partially etching the substrate 100, or may include an epitaxial layer grown from the substrate 100. In either case, they may be described as formed on the substrate. In addition, the fins may be described as "protruding from" the substrate, whether they are formed by partially etching the substrate 100 or by epitaxial growth. The first to the third fin-type patterns F1-F3 may include, for example, an elemental semiconductor material such as silicon or germanium. Further, the first to the third fin-type patterns F1-F3 may include, for example, a compound semiconductor such as IV-IV group compound semiconductor or III-V group compound semiconductor.

Consider, for example, the IV-IV group compound semiconductors in which the first to the third fin-type patterns F1-F3 may be a binary compound or a ternary compound comprising at least two or more of carbon (C), silicon (Si), germanium (Ge) or tin (Sn), or these compounds doped with a IV group element.

Consider the III-V group compound semiconductors in which the first to the third fin-type pattern F1-F3 may be one of a binary compound, a ternary compound or a quaternary compound which is formed by a combination of a III group element which may be at least one of aluminum (Al), gallium (Ga), or indium (In), with a V group element which may be one of phosphorus (P), arsenic (As) or antimony (Sb).

In the semiconductor device according to exemplary implementations, it is assumed that the first to the third fin-type patterns F1-F3 include silicon.

The gate electrode 200 may extend in the second direction. The gate electrode 200 may intersect the first to the third fin-type patterns F1-F3, respectively. For example, the gate electrode 200 may include portions respectively overlapping with the first to the third fin-type patterns F1-F3 which are spaced apart from one another. The first to the third fin-type patterns F1-F3 may include overlapping portions and non-overlapping portions with the gate electrode 200, respectively.

Specifically, the first fin-type pattern F1 may include a first portion F1-1 overlapping with the gate electrode 200, and a second portion F1-2 non-overlapping with the gate electrode 200. The second portion F1-2 of the first fin-type pattern F1 may be disposed on both sides of the first portion F1-1 of the first fin-type pattern F1 in the first direction X1. The first portion F1-1 of the first fin-type pattern F1 may be referred to as a central or center portion.

As shown in FIGS. 2 to 5, the gate electrode 200 may include a first metal layer 210 and a second metal layer 220. Alternatively, the gate electrode 200 may be in such a form in which three or more metal layers are stacked on one another. The first metal layer 210 plays a role of adjusting work function, and the second metal layer 220 plays a role of filling the space formed by the first metal layer 210. For example, the first metal layer 210 may include at least one of TiN, WN, TiAl, TiAlN, TaN, TiC, TaC, TaCN, TaSiN and a combination thereof, but is not limited thereto. Further, the second metal layer 220 may include at least one of, for example, W, Al, Cu, Co, Ti, Ta, poly-Si, SiGe and a metal alloy, but is not limited thereto.

For example, the gate electrode 200 described above may be formed by a replacement process (or gate last process), but is not limited thereto.

The gate insulating films 130, 140 may be formed between the first to the third fin-type patterns F1-F3 and the gate electrode 200, and between the second field insulating film 120 and the gate electrode 200. The gate insulating films 130, 140 may include, for example, an interfacial film 130 and a high-k dielectric film 140.

The interfacial film 130 may be formed by partially oxidizing the first to the third fin-type patterns F1-F3. The interfacial film 130 may be formed along the profile of the first to the third fin-type patterns F1-F3 protruding upward farther than the upper surface of the second field insulating film 120. When the first to the third fin-type patterns F1-F3 are silicon fin-type patterns that include silicon, the interfacial film 130 may include a silicon oxide film.

As illustrated in FIG. 3, the interfacial film 130 may not be formed along the upper surface of the second field insulating film 120, but exemplary implementations are not limited thereto. Depending on methods of forming the interfacial film 130, the interfacial film 130 may be formed along the upper surfaces of the first field insulating film 110 and the second field insulating film 120.

Alternatively, even in an example where the first field insulating film 110 and the second field insulating film 120 include silicon oxide, the interfacial film 130 may be formed along the upper surfaces of the first field insulating film 110 and the second field insulating film 120, if the silicon oxide included in the first field insulating film 110 and the second field insulating film 120 have different properties from the silicon oxide layer included in the interfacial layer 130.

The high-k dielectric film 140 may be formed between the interfacial film 130 and the gate electrode 200. It may be formed along the profile of the first to the third fin-type patterns F1-F3 protruding upward higher than the upper surfaces of the first field insulating film 110 and the second field insulating film 120. Further, the high-k dielectric insulating film 140 may be formed between the gate electrode 200, and the first field insulating film 110 and the second field insulating film 120.

The high-k dielectric film 140 may include a high-k dielectric material having a higher dielectric constant than silicon oxide film. For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

A gate spacer 160 may be disposed on a sidewall of the gate electrode 200 extending in the second direction Y1. The gate spacer 160 may include, for example, at least one of silicon nitride (SiN), silicon oxynitride (SiON), silicon oxide (SiO$_2$), silicon oxycarbonitride (SiOCN), or a combination thereof.

The source/drain 115 may be formed on both sides of the gate electrode 200 in the first direction X1, and on the first fin-type pattern F1.

For example, the source/drain 115 may be formed on the second portion F1-2 of the first fin-type pattern F1.

The source/drain 115 may include an epitaxial layer formed by epitaxy. For example, the source/drain 115 may be an elevated source/drain. The epitaxial layer may fill a recess F1r formed in the second portion F1-2 of the first fin-type pattern F1.

An outer circumference of the source/drain 115 may take on a variety of shapes. For example, the outer circumference of the source/drain 115 may be at least one of diamond, circle and rectangle shapes. FIG. 5 illustrates a diamond shape (or pentagon or hexagon shape) for example.

When the semiconductor device according to an exemplary implementation is a PMOS transistor, the source/drain 115 may include a compressive stress material. For example, the compressive stress material may be a material such as SiGe which has a higher lattice constant compared to Si. For example, the compressive stress material can enhance mobility of the carrier in the channel region by exerting compressive stress on the first fin-type pattern F1.

When the semiconductor device according to an exemplary implementation is an NMOS transistor, the source/drain 115 may include a tensile stress material. For example, when the first fin-type pattern F1 is silicon, the source/drain 115 may be a material such as SiC which has a smaller lattice constant than the silicon. For example, the tensile stress material can enhance mobility of the carrier in the channel region by exerting tensile stress on the first fin-type pattern F1.

The interlayer insulating film 190 may cover the first to the third fin-type patterns F1-F3, the source/drain 115, the gate electrode 200, and so on. The interlayer insulating film 190 may be formed on the second field insulating film 120.

For example, the interlayer insulating film 190 may include at least one of silicon oxide, silicon nitride, silicon oxynitride, and a low-k dielectric material with a smaller dielectric constant than silicon oxide. For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but is not limited thereto.

As shown in FIG. 3, a second shallow trench ST2 may be formed between the first fin-type pattern F1 and the second fin-type pattern F2, and a third shallow trench ST3 may be formed between the second fin-type pattern F2 and the third fin-type pattern F3. The first fin-type pattern F1 may be formed between the first shallow trench ST1 and the second shallow trench ST2, and the second fin-type pattern F2 may be formed between the second shallow trench ST2 and the third shallow trench ST3. The third fin-type pattern F3 may be formed between the third shallow trench ST3 and the fourth shallow trench ST4. Thus, for example with respect to the second fin-type pattern F2, the second shallow trench ST2 is adjacent to one side and the and the third shallow trench ST3 is adjacent to the other side of second fin-type pattern F2.

The second shallow trench ST2 and the third shallow trench ST3 may be positioned on both side surfaces of the second fin-type pattern F2. The width L1 of the second shallow trench ST2 may be different from the width L2 of the third shallow trench ST3. Further, the depth D1 of the second shallow trench ST2 may be different from the depth D2 of the third shallow trench ST3. Specifically, the width L1 of the second shallow trench ST2 may be narrower than the width L2 of the third shallow trench ST3. Further, the depth D1 of the second shallow trench ST2 may be shallower than the depth D2 of the third shallow trench ST3.

The first to the fourth shallow trenches ST1-ST4 are filled with the field insulating film. Specifically, the second shallow trench ST2 may be filled with the first field insulating film 110, and the third shallow trench ST3 may be filled with the second field insulating film 120. The field insulating film is formed as a dual structure of a lower field insulating film and an upper field insulating film Specifically, the lower field insulating film may be formed in lower portions of the first to the fourth shallow trenches ST1-ST4, and the upper field insulating film may be formed on the lower field insulating film. Accordingly, the first lower field insulating film 110b may be formed in the lower portion of the second shallow trench ST2, and the first upper field insulating film 110a may be formed on the first lower field insulating film 110b of the second shallow trench ST2. The second lower field insulating film 120b may be formed in the lower portion of the third shallow trench ST3, and the second upper field insulating film 120a may be formed on the second lower field insulating film 120b of the third shallow trench ST3.

Instead of exposing the second shallow trench ST2 and the third shallow trench ST3, respectively, the first upper field insulating film 110a and the second upper field insulating film 120a may expose a portion of a side surface of the second fin-type pattern F2.

The width DL1 of the lower portion of the first shallow trench ST1 may be smaller than the width L1 of the upper portion of the second shallow trench ST2. A first stepped portion S1 may be formed at a boundary between the upper portion and the lower portion of the second shallow trench ST2. This will be described below.

The width DL2 of the lower portion of the third shallow trench ST3 may be smaller than the width L2 of the upper portion of the third shallow trench ST3. A first stepped portion S1 may be formed at a boundary between the upper portion and the lower portion of the third shallow trench ST3. This will be described below.

The first lower field insulating film 110b and the second lower field insulating film 120b may fill the lower portions of the second shallow trench ST2 and the third shallow trench ST3. In this case, the upper surfaces of the first lower field insulating film 110b and the second lower field insulating film 120b may have a bowl shape. That is, the shape may have a lower center and higher perimeter. Accordingly, the heights of the upper surfaces of the first lower field insulating film 110b and the second lower field insulating film 120b may be lower than, or equal to the heights of the points where these meet the second fin-type pattern F2.

The second fin-type pattern F2 will be described as an example, since the other fin-type patterns have similar shape as the second fin-type pattern F2.

As shown in FIG. 4, the second fin-type patterns F2 may include a lower portion F2L, an upper portion F2U, and a first stepped portion S1. Specifically, the second fin-type pattern F2 may be divided into the lower portion F2L and the upper portion F2U by the first stepped portion S1. That is, the lower portion F2L of the second fin-type pattern F2 may be defined to be the portion that protrudes from the substrate 100 up to the first stepped portion S1 of the second fin-type pattern F2. Likewise, the upper portion of the second fin-type pattern F2 may be defined to be the portion spanning from the first stepped portion S1 to the uppermost portion of the second fin-type pattern F2. The width W1 of the lower portion F2L of the second fin-type pattern F2 may be greater than the widths W2, W3 of the upper portion F2U of the second fin-type pattern F2.

The expression 'stepped portion' as used herein refers to a point or area at which a decreasing slope of the surface turns into an increasing slope, or a point or area at which an increasing slope of the surface turns into a decreasing slope. That is, the "stepped portion" as used herein may refer to a point of inflection of the profile of the surface, i.e. a curvilinear inflection point. In other words, the "stepped portion" as used herein may refer to a point or area at which the profile of the surface turns from concave downwards into concave upwards, or a point or area at which the profile of the surface turns from the concave upwards into concave downwards. That is, the "stepped portion" refers to a point or area at which the sign of changes of the slope of the profile is changed.

Accordingly, the first stepped portion S1 may be a point or area at which the sign of changes of the slope of the side surface profile of the second fin-type pattern F2 is changed. That is, the first stepped portion S1 may be a point or area at which the side surface profile of the second fin-type pattern F2 changes from concave downwards into concave upwards, or from concave upwards into concave downwards.

The lower portion F2L of the second fin-type pattern F2 may contact the first lower field insulating film 110b and the second lower field insulating film 120b. The first lower field insulating film 110b and the second lower field insulating film 120b may surround the lower portion F2L of the second fin-type pattern F2 on both sides of the second fin-type pattern F2. The upper portion F2U of the second fin-type pattern F2 may contact the first upper field insulating film 110a and the second upper field insulating film 120a. The first upper field insulating film 110a and the second upper field insulating film 120a may surround the upper portion of the second fin-type pattern F2 on both sides of the second fin-type pattern F2 on the first lower field insulating film 110b and the second lower field insulating film 120b.

Specifically, a portion of the upper portion F2U of the second fin-type pattern F2 may contact the first field insulating film 110a and the second field insulating film 120a. The upper portion F2U of the second fin-type pattern F2 may include a first upper portion F2U1 and a second upper portion F2U2. Specifically, the upper portion F2U of the second fin-type pattern F2 may be divided into the first upper portion F2U1 and the second upper portion F2U2 by the second stepped portion S2. For example, the first upper portion F2U1 of the second fin-type pattern F2 may be defined to be the portion spanning from the first stepped portion S1 to the second stepped portion S2. Likewise, the second upper portion of the first fin-type pattern F2 may be defined to be the portion spanning from the second stepped portion S2 to the uppermost portion of the second fin-type pattern F2. The width W2 of the second upper portion F2U1 of the second fin-type pattern F2 may be greater than the width W3 of the second upper portion F2U2 of the second fin-type pattern F2.

The first upper portion F2U1 of the second fin-type pattern F2 may contact the first upper field insulating film 110a and the second upper field insulating film 120a. The first upper field insulating film 110a and the second upper field insulating film 120a may surround the first upper portion F2U1 of the second fin-type pattern F2 on both sides of the second fin-type pattern F2. The second upper portion F2U2 of the second fin-type pattern F2 may not contact the first upper field insulating film 110a and the second upper field insulating film 120a. That is, the first upper field insulating film 110a and the second upper field insulating film 120a may expose the second upper portion F2U2 of the second fin-type pattern F2.

The second fin-type pattern F2 may include a first side surface and a second side surface. The first side surface may be the side surface contacted by the second shallow trench ST2, and the second side surface may be the side surface contacted by the third shallow trench ST3. As used herein, a side surface may be described as "contacting" a trench when it abuts the trench such that it defines all or part of the sidewall of the trench. The width of the third shallow trench ST3 on the second side surface may be greater than the width of the second shallow trench ST2.

The first stepped portion S1-1 on the first side surface of the second fin-type pattern F2 may be positioned higher than the first stepped portion S1-2 on the second side surface. During partial removal of the first lower field insulating film 110b and the second lower field insulating film 120b, due to the narrow pitch of the first fin-type pattern F1 and the second fin-type pattern F2, the first lower field insulating film 110b in the second shallow trench ST2 may be removed relatively less than in the other regions. As such, the first stepped portion S1-1 on the first side surface within the second shallow trench ST2 may be positioned higher than the first stepped portion S1-2 on the second side surface within the third shallow trench ST3. Accordingly, the upper surface of the first lower field insulating film 110b in the second shallow trench ST2 may be formed higher than the upper surface of the second lower field insulating film 120b in the third shallow trench ST3.

The second stepped portion S2-1 on the second side surface of the second fin-type pattern F2 may be positioned higher than the second stepped portion S2-2 on the second side surface. During partial removal of the first upper field insulating film 110a and the second upper field insulating film 120a, due to the narrow pitch between the first fin-type pattern F1 and the second fin-type pattern F2, the first upper field insulating film 110a in the second shallow trench ST2 may be removed relatively less than in the other regions. As such, the second stepped portion S2-1 on the first side surface within the second shallow trench ST2 may be positioned higher than the second stepped portion S2-2 on the second side surface within the third shallow trench ST3. Accordingly, the upper surface of the first upper field insulating film 110a in the second shallow trench ST2 may be formed higher than the upper surface of the second upper field insulating film 120a in the third shallow trench ST3.

For example, the first field insulating film 110 and the second field insulating film 120 may be oxide film, nitride film, oxynitride film or a film combining these. Alternatively, the first field insulating film 110 and the second field insulating film 120 may include, for example, at least one of silicon oxide, silicon nitride, silicon oxynitride, or a low-k dielectric material with a smaller dielectric constant than silicon oxide. For example, the low-k dielectric material may include flowable oxide (FOX), Torene silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The materials of the first lower field insulating film 110b and the second lower field insulating film 120b may be identical to the materials of the first upper field insulating film 110a and the second upper field insulating film 120a. For example, the materials of the first field insulating film 110 and the second field insulating film 120 may include $SiO_2$. However, exemplary embodiments are not limited to the specific examples provided above. Accordingly, the material of the first lower field insulating film 110b and the second lower field insulating film 120b and the materials of the first upper field insulating film 110a and the second upper field insulating film 120a may be different from each other.

The first lower field insulating film 110b and the second lower field insulating film 120b may include the same material as each other. Further, the first upper field insulating film 110a and the second upper field insulating film 120a may include the same material as each other. However, exemplary embodiments are not limited to the example given above.

The first lower field insulating film 110b and the second lower field insulating film 120b may have the same stress characteristic as each other. Further, the first upper field insulating film 110a and the second upper field insulating film 120a may have the same stress characteristic as each other. The first lower field insulating film 110b and the second lower field insulating film 120b, and the first upper field insulating film 110a and the second upper field insulating film 120a may have different stress characteristics from each other. That is, the first lower field insulating film 110b and the second lower field insulating film 120b may have a tensile stress characteristic, and the first upper field insulating film 110a and the second upper field insulating film 120a may have a compressive stress characteristic. In contrast, the first lower field insulating film 110b and the second lower field insulating film 120b may have the compressive stress characteristic, and the first upper field insulating film 110a and the second upper field insulating film 120a may have the tensile stress characteristic.

Alternatively, the first lower field insulating film 110b and the first upper field insulating film 110a may have the same stress characteristic as each other. Further, the second lower field insulating film 120b and the second upper field insulating film 120a may have the same stress characteristic as each other. In this case, the direction of inclination of the first field insulating film 110 and the second field insulating film 120 may be determined according to the volume and the type of stress of the second field insulating film 120.

For example, when the first field insulating film 110 has the tensile stress characteristic, and the second field insulating film 120 has the compressive stress characteristic, regardless of volume difference between the first field insulating film 110 and the second field insulating film 120, the second fin-type pattern F2 may be inclined toward the first field insulating film 110.

If the first field insulating film 110 and the second field insulating film 120 have the same stress characteristic (e.g., compressive stress characteristic), due to a greater volume of the second field insulating film 120 relative to the volume of the first field insulating film 110, the force by the compressive stress characteristic of the second field insulating film 120 is stronger than the force by the compressive stress characteristic of the first field insulating film 110. As a result, the second fin-type pattern F2 may be inclined to a direction of the first field insulating film 110.

As shown in FIG. 3, the first fin-type pattern F1 and the second fin-type pattern F2 are inclined closer to each other, in which case the tensile stress of the first fin-type pattern 110 of the second shallow trench ST2 may be greater than the tensile stress of the second field insulating film 120. In other words, the compressive stress of the first field insulating film 110 may be less than the compressive stress of the second field insulating film 120. As a result, the second fin-type pattern F2 may be inclined under the force toward the first fin-type pattern F1. The degree of inclination of the first fin-type pattern F1 and the second fin-type pattern F2 may be different from each other. However, exemplary embodiments are not limited to the example given above.

The first fin-type pattern F1 may be formed such that the width a1 from the center line of the first fin-type pattern F1 to the first side surface closer to the first shallow trench ST1 is smaller than the width a2 from the center line to the second side surface closer to the second shallow trench ST2. The center line may be the center line of the width of the first fin-type pattern F1 on a contact surface between the first fin-type pattern F1 and the substrate 100.

The second fin-type pattern F2 may be formed such that the width a3 from the center line of the second fin-type pattern F2 to the first side surface closer to the second shallow trench ST2 is larger than the width a4 from the center line to the second side surface closer to the third shallow trench ST3. The center line may be the center line of the width of the second fin-type pattern F2 on a contact surface between the second fin-type pattern F2 and the substrate 100.

According to inclining of the first fin-type pattern F1 and the second fin-type pattern F2, the height h1 of the uppermost portions of the first fin-type pattern F1 and the second fin-type pattern F2 may be lower than the height h2 of the uppermost portion of the third fin-type pattern F3 with reference to the lower surface of the substrate 100.

In some exemplary embodiments, the first pitch P1 and the second pitch P2 may be identical. In this case, the width DL1 of the lower portion of the second shallow trench ST2 may be identical to the width DL2 of the lower portion of the third shallow trench ST3. Meanwhile, as the first fin-type pattern F1 and the second fin-type pattern F2 are inclined to a direction closer to each other, the width Dh1 of the upper portion of the second shallow trench ST2 and the width Dh2 of the upper portion of the third shallow trench ST3 may be different from each other. That is, even when the lower portions of the trenches have the same width, the widths of the upper portions may be varied from one another depending on whether or not the fin-type patterns are inclined. In other words, even when the lower portions of the fin-type patterns are at a same distance, the distances among the upper portions of the fin-type patterns may be different from one another.

The stress characteristics of the first lower field insulating film 110b and the second lower field insulating film 120b, and the first upper field insulating film 110a and the second upper field insulating film 120a may be determined according to the bonding energy (or binding energy) of the materials of the first lower field insulating film 110b and the second lower field insulating film 120b, and the first upper field insulating film 110a and the second upper field insulating film 120a. That is, a material in a state of low bonding energy may greatly shrink in size as the bonding energy increases by the heat treatment. That is, the material in a state of low bonding energy may have a relatively higher shrink rate. On the contrary, a material in a state of high bonding energy may have relatively lower shrink rate even by the heat treatment of the process. Accordingly, the material with a relatively higher shrink rate may have the tensile stress characteristic, while the material with a relatively lower shrink rate may have the compressive stress characteristic.

The materials with different stress characteristics may have different etch rates from one another. Accordingly, these may have different etch characteristics during etching process. The expression 'same materials' as used herein refers to materials of same composition. However, even the "same materials" may have varying stress characteristics or etching characteristics depending on the bonding energy or shrink rates as described above.

According to some exemplary implementations, the first lower field insulating film 110b and the second lower field insulating film 120b, and the first upper field insulating film 110a and the second upper field insulating film 120a may include the "same material" of the same composition, but with varying stress characteristics from one another. Alternatively, the first lower field insulating film 110b and the second lower field insulating film 120b, and the first upper field insulating film 110a and the second upper field insulating film 120a may have different etch characteristics, i.e., different etch rates from each other.

After being deposited to cover both the side surface and the upper surface of the second fin-type pattern F2, the first lower field insulating film 110b and the second lower field insulating film 120b may be partially removed by the recess process. At this time, as the first lower field insulating film 110b and the second lower field insulating film 120b are partially removed, the surface of the second fin-type pattern F2 may be partially removed. As a result, the first stepped portion S1 of the second fin-type pattern F2 may be formed. After the first lower field insulating film 110b and the second lower field insulating film 120b are partially removed, the first upper field insulating film 110a and the second upper field insulating film 120a may be formed on the first lower field insulating film 110b and the second lower field insulating film 120b. Accordingly, the first stepped portion S1 may be formed at points where the boundary lines of the first lower field insulating film 110b and the second lower field insulating film 120b, and the first upper field insulating film 110a and the second upper field insulating film 120a meet the second fin-type pattern F2. Additionally, the lower portion F2L and the upper portion F2U of the second fin-type pattern F2 may be distinguished from each other by the first stepped portion S1.

After the first upper field insulating film 110a and the second upper field insulating film 120a are deposited to cover both the side surface and the upper surface of the second fin-type pattern F2 on the first lower field insulating film 110b and the second lower field insulating film 120b, these may be partially removed by the process of exposing the second fin-type pattern F2. At this time, as the first upper field insulating film 110a and the second upper field insulating film 120a are partially removed, the surface of the second fin-type pattern F2 may be partially removed. As a result, the second stepped portion S2 of the second fin-type pattern F2 may be formed. Further, after the process of exposing the second fin-type pattern F2, the width of the exposed portion of the second fin-type pattern F2 may be further narrowed by the process of smoothening the shape of the exposed portion of the second fin-type pattern F2. Accordingly, the portion surrounded by the first upper field insulating film 110a and the second upper field insulating film 120a (i.e., first upper portion F2U1) and the exposed portion (i.e., second upper portion F2U2) may be distinguished by the second stepped portion S2.

In a semiconductor device according to some exemplary implementations, the first lower field insulating film 110b and the second lower field insulating film 120b, and the first upper field insulating film 110a and the second upper field insulating film 120a may have different stress characteristics from each other. Accordingly, the positions where the first lower field insulating film 110b and the second lower field insulating film 120b, and the first upper field insulating film 110a and the second upper field insulating film 120a meet the second fin-type pattern F2 may be adjusted.

Specifically, when the field insulating film formed with only one stress characteristic is used, the associated fin-type pattern may bend according to the volume of the field insulating film. An occurrence of unintended bend in the fin-type pattern may cause reduced margins between the fin-type patterns, and may result in possible mis-alignment of the electric wiring structure with contact structures. Accordingly, to prevent such misalignment problems, the field insulating film may be so configured as to include the lower field insulating film and the upper field insulating film having different stress characteristics from each other.

Hereinbelow, a semiconductor device according to another exemplary embodiment will be described with reference to FIGS. 1 and 6A. Meanwhile, elements or operations overlapping with those described above with reference to FIGS. 1 to 5 will be mentioned as briefly as possible or omitted for the sake of brevity.

Figure 6A:
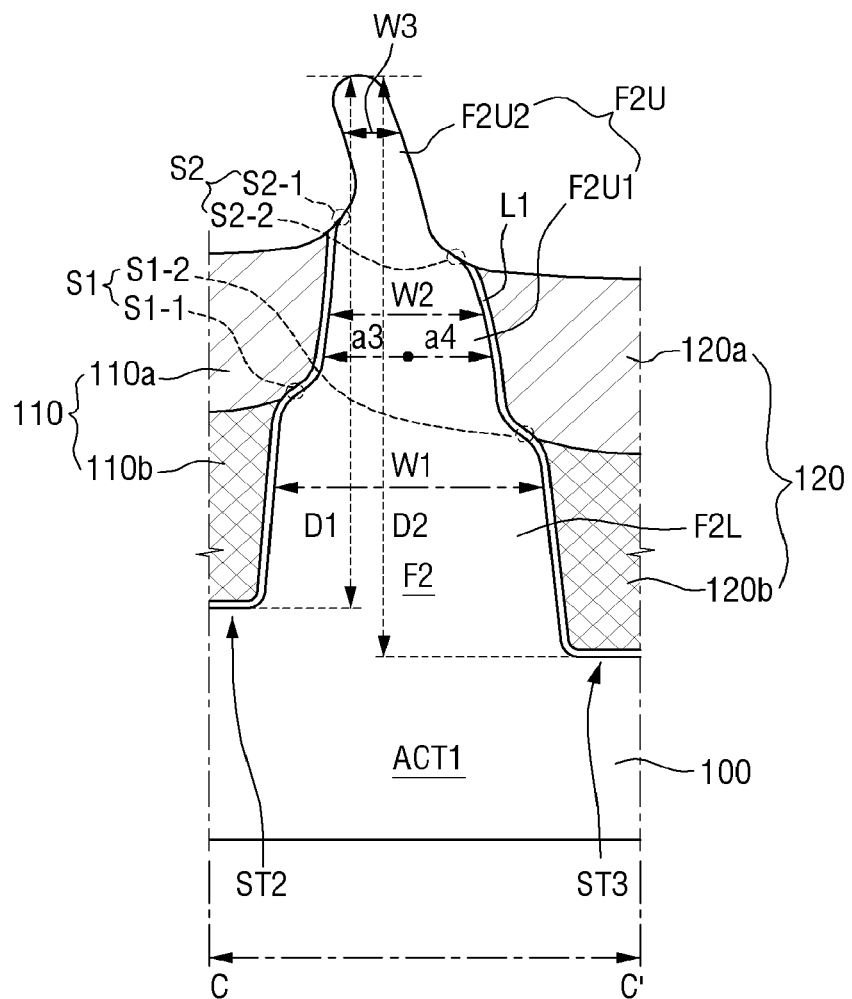
FIG. 6A is a cross sectional view provided to explain a semiconductor device according to some exemplary implementations.

FIG. 6A is a cross sectional view provided to explain a semiconductor device according to some exemplary embodiments.

As shown in FIGS. 1 and 6A, the semiconductor device according to some exemplary implementations includes a liner L1.

The liner L1 may be formed on a side surface of the second fin-type pattern F2. The liner L1 may be formed conformally along the profile of the surface of the side surface of the second fin-type pattern F2. The liner L1 may be formed between the second fin-type pattern F2, and the first field insulating film 110 and the second field insulating film 120. That is, the liner L1 may be formed on the surfaces of the lower portion F2L and the first upper portion F2U1 of the second fin-type pattern F2, and may not be formed on the surface of the second upper portion F2U2. However, exemplary embodiments are not limited to any specific example only. Accordingly, it may also be formed on the surface of the second upper portion F2U2 depending on manufacturing process. Likewise, depending on materials and manufacturing process, the liner L1 may be formed on not only the surface of the second fin-type pattern F2, but also the upper surface of the substrate 100.

The liner L1 may be formed of a material that applies a first stress to a channel region of the second fin-type pattern F2. The liner L1 may play a role of enhancing carrier mobility in the channel region, by introducing the first stress to the channel region of the second fin-type pattern F2. In some exemplary embodiments, when the channel region is an N-type channel region, the liner L1 may be formed of a material that applies a tensile stress to the channel region. For example, the liner L1 may be formed of silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. In some exemplary embodiments, the liner L1 may have a thickness of approximately 10-100 Å.

Hereinbelow, a semiconductor device according to some exemplary embodiments will be described with reference to FIGS. 1 and 6B. Elements or operations overlapping with the exemplary embodiment described above with reference to FIGS. 1 to 6A will be mentioned as briefly as possible or omitted for the sake of brevity.

Figure 6B:
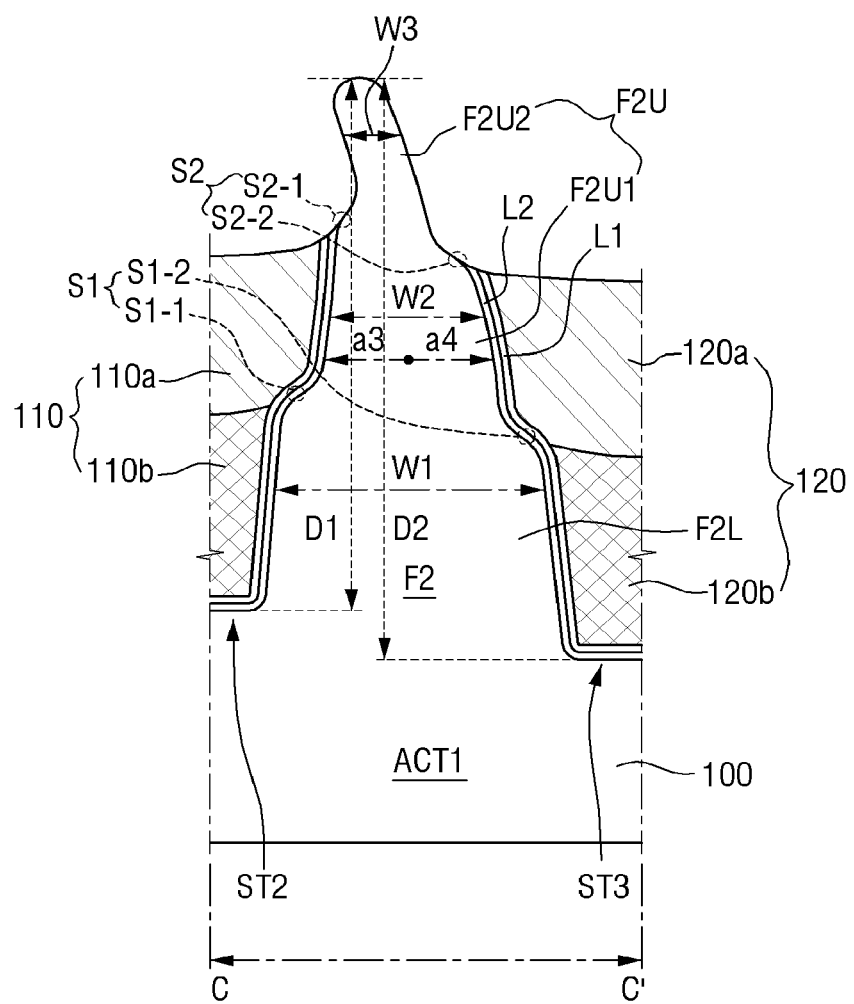
FIG. 6B is a cross sectional view provided to explain a semiconductor device according to some exemplary implementations.

FIG. 6B is a cross sectional view provided to explain a semiconductor device according to some exemplary embodiments.

As shown in FIGS. 1 and 6B, the semiconductor device according to some exemplary embodiments may additionally include an insulating liner L2.

The insulating liner L2 may be formed between the liner L1, and the first to the third fin-type patterns F1-F3.

The insulating liner L2 may be formed of oxide film. For example, the insulating liner L2 may be formed of natural oxide film. In some exemplary embodiments, the oxide film constituting the insulating liner L2 may be obtained by performing a process of thermally oxidizing the surfaces of the first to the third fin-type patterns F1-F3. In some exemplary embodiments, the insulating liner L2 may have a thickness of approximately 10-100 Å.

Hereinbelow, a semiconductor device according to some exemplary embodiments will be described with reference to FIGS. 1 and 7. Elements or operations overlapping with the exemplary embodiment described above with reference to FIGS. 1 to 6B will be mentioned as briefly as possible or omitted for the sake of brevity.

Figure 7:
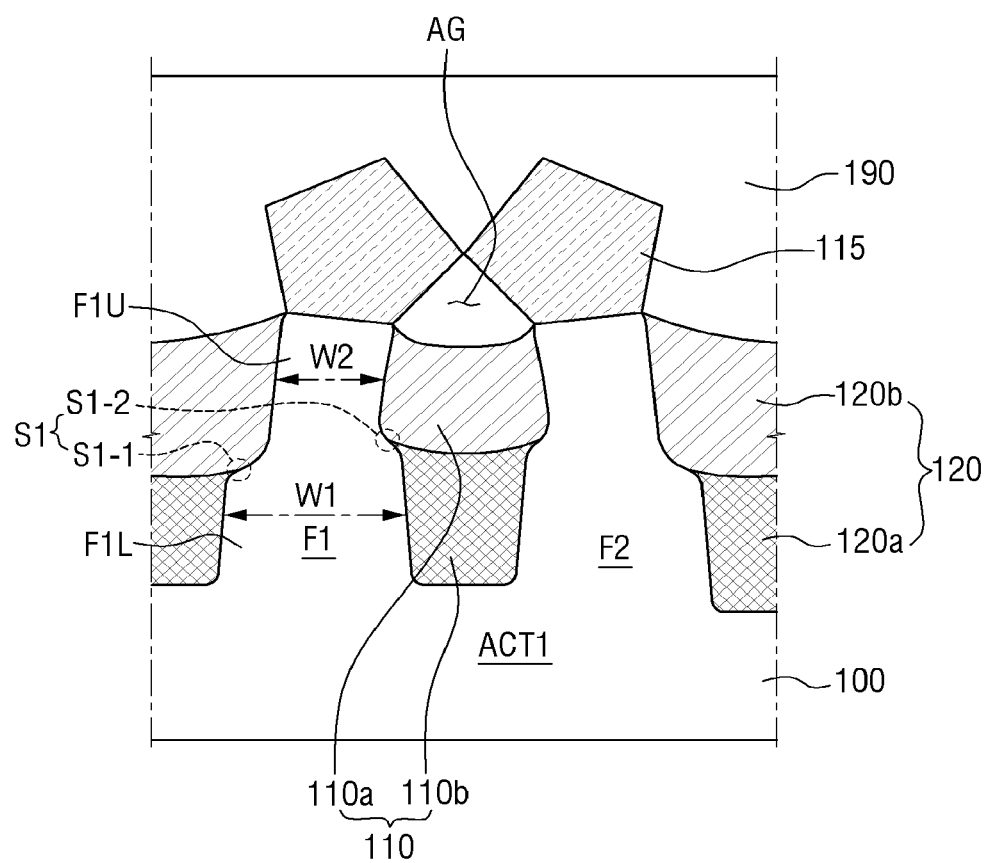
FIG. 7 is a cross sectional view provided to explain a semiconductor device according to some exemplary implementations.

FIG. 7 is a cross sectional view provided to explain a semiconductor device according to some exemplary embodiments;

As shown in FIGS. 1 and 7, in a semiconductor device according to some exemplary implementations, the source/drains 115 formed on the first fin-type pattern F1 and the second fin-type pattern F2 may contact each other.

That is, the source/drains 115 may be merged with each other, and the first fin-type pattern F1 and the second fin-type pattern F2 may operate as one single device. In this case, in order to contact the source/drains 115 to each other, it may be advantageous that the first fin-type pattern F1 and the second fin-type pattern F2 are inclined to a direction closer to each other. Accordingly, by adjusting the heights and the widths of the first field insulating film 110 and the second field insulating film 120, it is possible to cause the first fin-type pattern F1 and the second fin-type pattern F2 to incline to a direction closer to each other, and as a result, cause the source/drains 115 to merge with each other more easily.

As illustrated in FIG. 7, because the source/drains 115 may have a convex polygonal shape, an air gap AG may be formed underneath when the source/drains 115 are merged. The air gap AG may refer to an empty space formed between the first upper field insulating film 110a and the source/drains 115.

Hereinbelow, a semiconductor device according to some exemplary implementations will be described with reference to FIGS. 1 and 8. Elements or operations overlapping with the exemplary implementations described above with reference to FIGS. 1 to 7 will be mentioned as briefly as possible or omitted for the sake of brevity.

Figure 8:
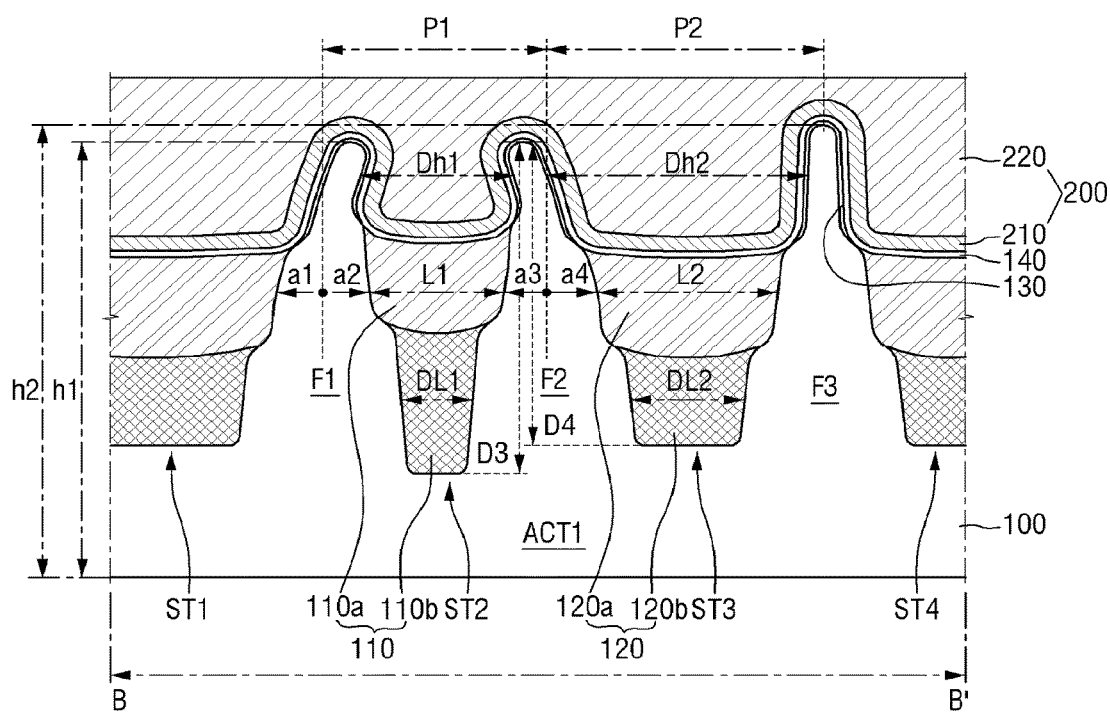
FIG. 8 is a cross sectional view provided to explain a semiconductor device according to some exemplary implementations.

FIG. 8 is a cross sectional view provided to explain a semiconductor device according to some exemplary embodiments.

As shown in FIGS. 1 and 8, the depth D3 of the second shallow trench ST2 may be deeper than the depth D4 of the third shallow trench ST3. In this case, the width L1 of the second shallow trench ST2 may be narrower than the width L2 of the third shallow trench ST3.

The degrees of tensile stress and compressive stress of the first field insulating film 110 may be determined according to the volume of the first field insulating film. That is, the degree of tensile stress and compressive stress of the first field insulating film 110 may increase as the volume becomes greater.

According to an exemplary implementation, the degree of inclination of the second fin-type pattern F2 may be adjusted by increasing the depth of the second shallow trench ST2. Specifically, when the first lower field insulating film 110b and the second lower field insulating film 120b have the tensile stress characteristic and the first upper field insulating film 110a and the second upper field insulating film 120a have the compressive stress characteristic, because the volume of the second upper field insulating film 120a is greater than the volume of the first upper field insulating film 110a, the second fin-type pattern F2 may be inclined to a direction of the first field insulating film 110. In this case, the degree of inclination of the second fin-type pattern F2 may be reduced as the depth D3 of the second shallow trench ST2 becomes deeper.

Alternatively, the first lower field insulating film 110b and the second lower field insulating film 120b, and the first upper field insulating film 110a and the second upper field insulating film 120a may all have the compressive stress characteristic, but even in this case, the degree of inclination of the second fin-type pattern F2 may be still be reduced as the depth D3 of the second shallow trench ST2 becomes deeper.

That is, it is possible to adjust the directions and degrees of inclination of the fin-type patterns by adjusting the stress characteristics and the volumes of the first field insulating film 110 and the second field insulating film 120.

Hereinbelow, a semiconductor device according to some exemplary implementations will be described with reference to FIGS. 1 and 9. Elements or operations overlapping with the exemplary implementations described above with reference to FIGS. 1 to 8 will be mentioned as briefly as possible or omitted for the sake of brevity.

Figure 9:
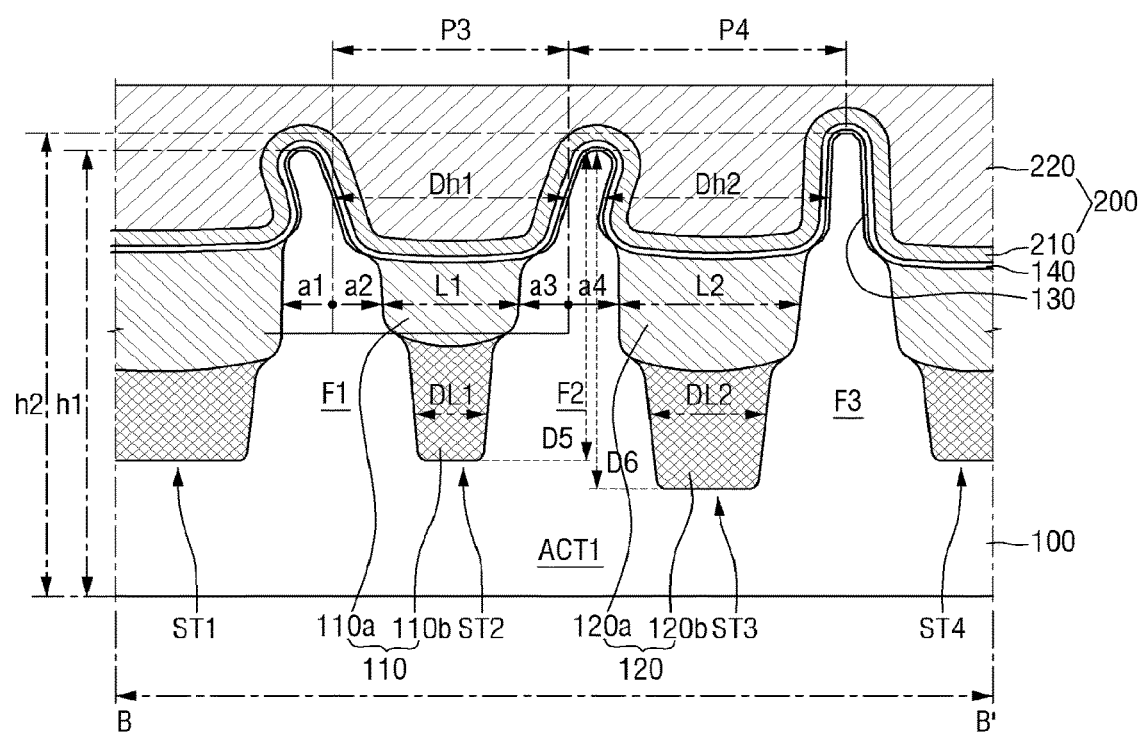
FIG. 9 is a cross sectional view provided to explain a semiconductor device according to some exemplary implementations.

FIG. 9 is a cross sectional view provided to explain a semiconductor device according to some exemplary implementations.

As shown in FIGS. 1 and 9, the first fin-type pattern F1 and the second fin-type pattern F2 may be inclined to a direction away from each other.

The first fin-type pattern F1 may be formed such that the width a1 from a center line of the first fin-type pattern F1 to a first side surface closer to the first shallow trench ST1, may be greater than the width a2 from the center line to a second side surface closer to the second shallow trench ST2. The center line may be the center line of the width of the first fin-type pattern F1 on a contact surface between the first fin-type pattern F1 and the substrate 100.

The second fin-type pattern F2 may be formed such that the width a3 from the center line of the second fin-type pattern F2 to the first side surface closer to the second shallow trench ST2 is smaller than the width a4 from the center line to the second side surface closer to the third shallow trench ST3. The center line may be the center line of the width of the second fin-type pattern F2 on a contact surface between the second fin-type pattern F2 and the substrate 100.

According to inclining of the first fin-type pattern F1 and the second fin-type pattern F2, the height h1 of the uppermost portions of the first fin-type pattern F1 and the second fin-type pattern F2 may be lower than the height h2 of the uppermost portion of the third fin-type pattern F3 with reference to the lower surface of the substrate 100.

The width L1 of the second shallow trench ST2 may be different from the width L2 of the third shallow trench ST3. Further, the depth D5 of the second shallow trench ST2 may be different from the depth D6 of the third shallow trench. Specifically, the width L1 of the second shallow trench ST2 may be narrower than the width L2 of the third shallow trench ST3. Further, the depth D5 of the second shallow trench ST2 may be shallower than the depth D6 of the third shallow trench ST3.

According to an exemplary implementation, the degree of inclination of the second fin-type pattern F2 may be adjusted by making the depth of the second shallow trench ST2 shallower. Specifically, when the first lower field insulating film 110b and the second lower field insulating film 120b have the compressive stress characteristic and the first upper field insulating film 110a and the second upper field insulating film 120a have the tensile stress characteristic, because the volume of the second upper field insulating film 120a is greater than the volume of the first upper field insulating film 110a, the second fin-type pattern F2 may be inclined to a direction of the second field insulating film 120. In this case, the degree of inclination of the second fin-type pattern F2 may be reduced as the depth D5 of the second shallow trench ST2 becomes shallower.

Alternatively, the first lower field insulating film 110b and the second lower field insulating film 120b, and the first upper field insulating film 110a and the second upper field insulating film 120a may all have the tensile stress characteristic, but even in this case, the degree of inclination of the second fin-type pattern F2 may be still be reduced as the depth D5 of the second shallow trench ST2 becomes shallower.

That is, it is possible to adjust the directions and degrees of inclination of the fin-type patterns by adjusting the stress characteristics and the volumes of the first field insulating film 110 and the second field insulating film 120.

Hereinbelow, a semiconductor device according to some exemplary implementations will be described with reference to FIGS. 1 and 10. Elements or operations overlapping with the exemplary implementations described above with reference to FIGS. 1 to 9 will be mentioned as briefly as possible or omitted for the sake of brevity.

Figure 10:
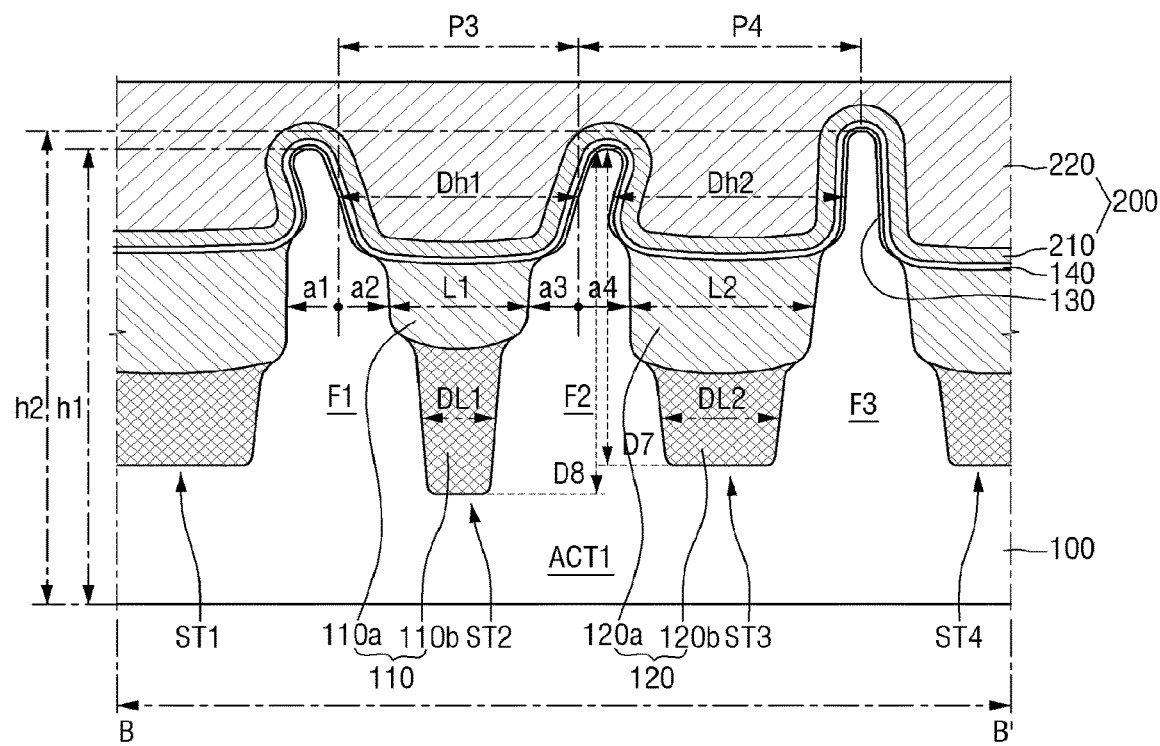
FIG. 10 is a cross sectional view provided to explain a semiconductor device according to some exemplary implementations.

FIG. 10 is a cross sectional view provided to explain a semiconductor device according to some exemplary implementations.

As shown in FIGS. 1 and 10, the width L1 of the second shallow trench ST2 may be different from the width L2 of the third shallow trench ST3. Further, the depth D8 of the second shallow trench ST2 may be different from the depth D7 of the third shallow trench. Specifically, the width L1 of the second shallow trench ST2 may be narrower than the width L2 of the third shallow trench ST3. Further, the depth D8 of the second shallow trench ST2 may be deeper than the depth D7 of the third shallow trench ST3.

According to an exemplary implementation, the degree of inclination of the second fin-type pattern F2 may be adjusted by making the depth of the second shallow trench ST2 deeper. Specifically, when the first lower field insulating film 110b and the second lower field insulating film 120b have the compressive stress characteristic and the first upper field insulating film 110a and the second upper field insulating film 120a have the tensile stress characteristic, because the volume of the second upper field insulating film 120a is greater than the volume of the first upper field insulating film 110a, the second fin-type pattern F2 may be inclined to a direction of the second field insulating film 120. In this case, the degree of inclination of the second fin-type pattern F2 may be reduced as the depth D8 of the second shallow trench ST2 becomes deeper.

Alternatively, the first lower field insulating film 110b and the second lower field insulating film 120b, and the first upper field insulating film 110a and the second upper field insulating film 120a may all have the tensile stress characteristic, but even in this case, the degree of inclination of the second fin-type pattern F2 may be still be reduced as the depth D8 of the second shallow trench ST2 becomes deeper.

That is, it is possible to adjust the directions and degrees of inclination of the fin-type patterns by adjusting the stress characteristics and the volumes of the first field insulating film 110 and the second field insulating film 120.

Hereinbelow, a semiconductor device according to some exemplary implementations will be described with reference to FIGS. 1 and 11. Elements or operations overlapping with those described above with reference to FIGS. 1 to 10 will be mentioned as briefly as possible or omitted for the sake of brevity.

Figure 11:
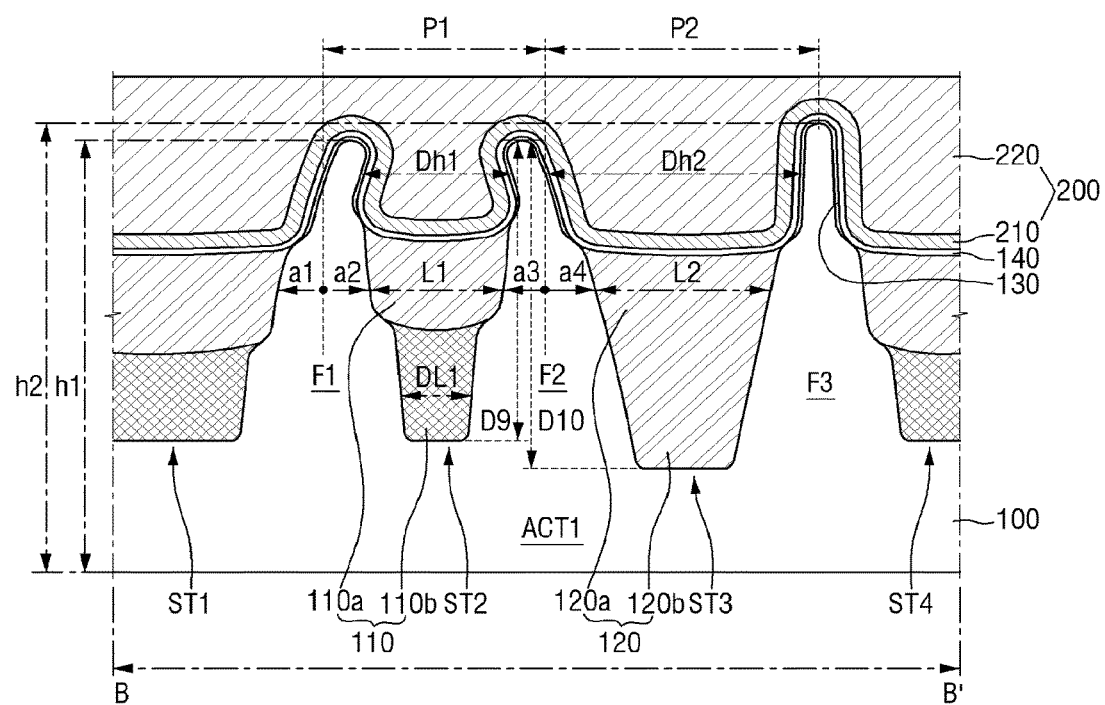
FIG. 11 is a cross sectional view provided to explain a semiconductor device according to some exemplary implementations.

FIG. 11 is a cross sectional view provided to explain a semiconductor device according to some exemplary implementations.

As shown in FIGS. 1 and 11, the second field insulating film 120 may be formed to be a single-layered film rather than a double-layered film. The second field insulating film 120 may have one characteristic of the tensile stress characteristic or the compressive stress characteristic. That is, it may be easier to exert force on the second fin-type pattern F2, because the second field insulating film 120 has one type of stress characteristic.

As shown in FIG. 11, the second field insulating film 120 may have the compressive stress characteristic, and according to this, the second fin-type pattern F2 may be inclined to a direction of the second field insulating film 120.

The width L1 of the second shallow trench ST2 may be different from the width L2 of the third shallow trench ST3. Further, the depth D9 of the second shallow trench ST2 may be different from the depth D10 of the third shallow trench. Specifically, the width L1 of the second shallow trench ST2 may be narrower than the width L2 of the third shallow trench ST3. Further, the depth D9 of the second shallow trench ST2 may be shallower than the depth D10 of the third shallow trench ST3.

According to an exemplary implementation, it is possible to cause the second fin-type pattern F2 to be inclined, by forming the third shallow trench ST3 with a single material and causing a volume difference from the material of the second shallow trench ST2. That is, when the third shallow trench ST3 has a single material, one stress characteristic is represented by the total volume. Accordingly, it is possible to further increase the degree of inclination of the second fin-type pattern F2.

Hereinbelow, a semiconductor device according to yet another exemplary implementation will be described with reference to FIGS. 12 and 13. Elements or operations overlapping with those described above with reference to FIGS. 1 to 11 will be mentioned as briefly as possible or omitted for the sake of brevity.

Figure 12:
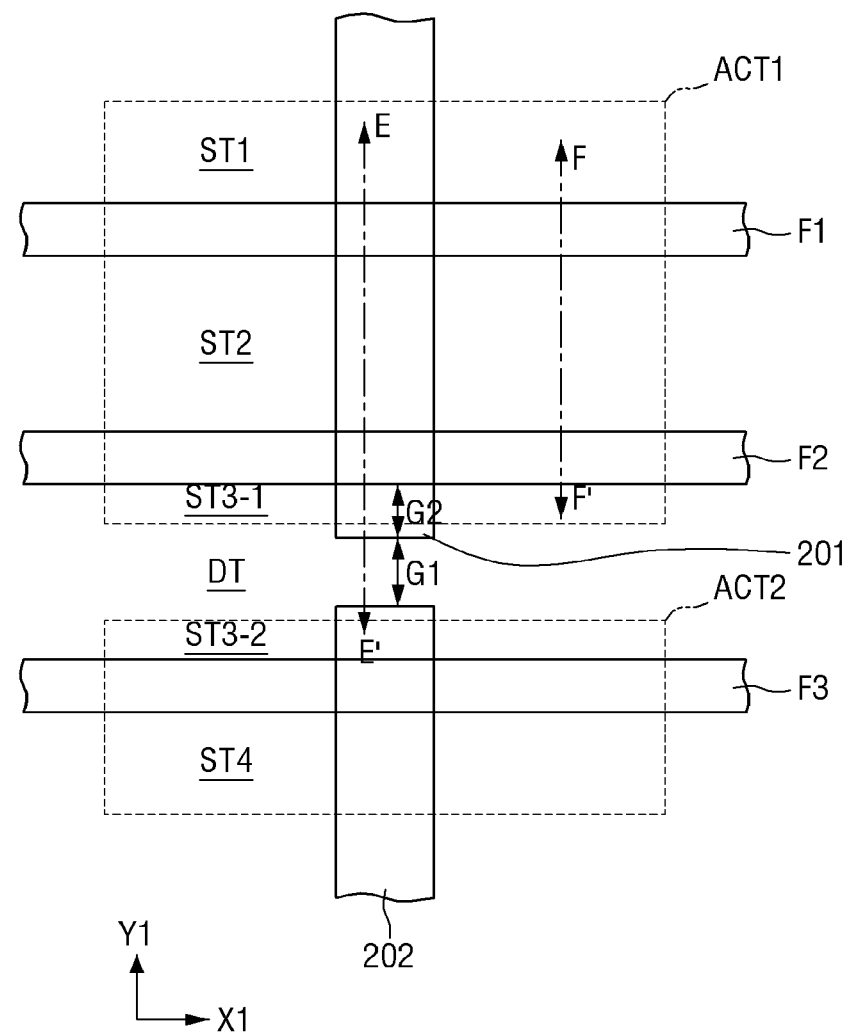
FIG. 12 is a layout diagram provided to explain a semiconductor device according to some exemplary implementations.
Figure 13:
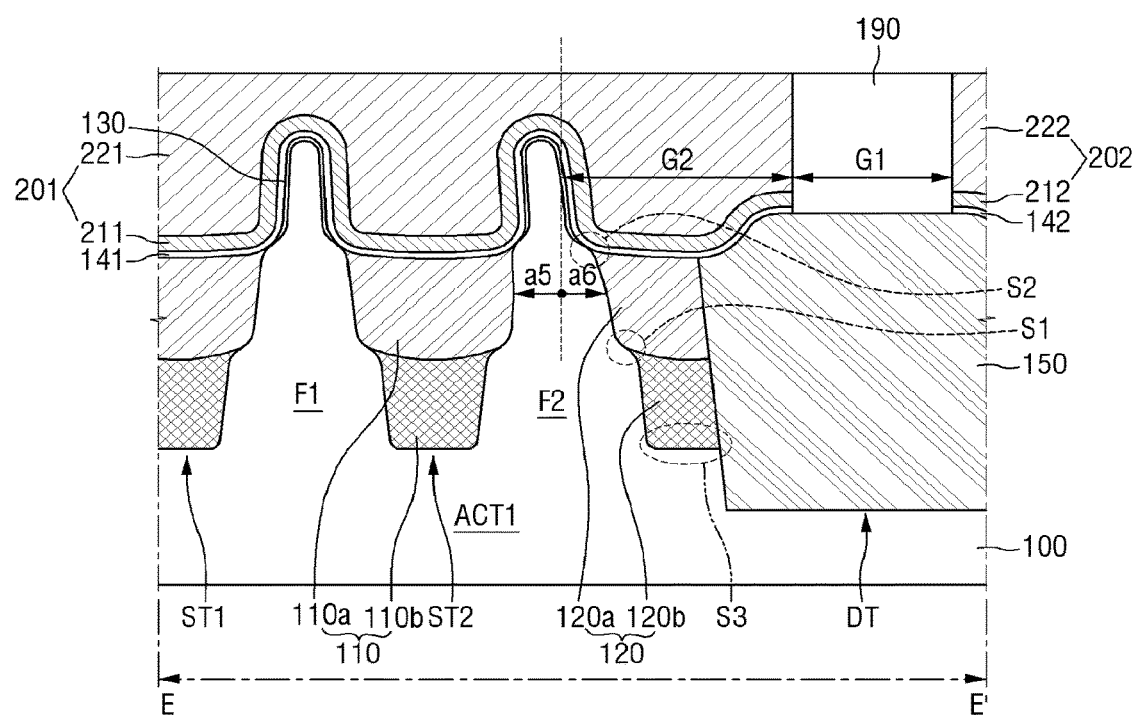
FIG. 13 is a cross sectional view taken on line E-E' of FIG. 12.

FIG. 12 is a layout diagram provided to explain a semiconductor device according to some exemplary implementations, and FIG. 13 is a cross sectional view taken on line E-E' of FIG. 12.

As shown in FIGS. 12 and 13, the semiconductor device according to some exemplary implementations includes a third field insulating film 150, a first gate electrode 201, first gate insulating films 130, 140, a second gate electrode 202 and a second gate insulating film 142. In the exemplary implementation of FIGS. 12 and 13, a deep trench DT may be formed in the center of the third shallow trenches ST3-1, ST3-2.

The third field insulating film 150 may fill the deep trench DT. The third field insulating film 150 may contact the first field insulating film 110 and the second field insulating film 120. The third field insulating film 150 may include the same material as the first field insulating film 110 or the second field insulating film 120. For example, the third field insulating film may include at least one of silicon oxide, silicon nitride, silicon oxynitride, and a low-k dielectric material with a smaller dielectric constant than silicon oxide.

The upper surface of the third field insulating film 150 may be higher than the upper surface of the second field insulating film 120. However, exemplary implementations are not limited to the specific examples provided above. Accordingly, the upper surface of the third field insulating film 150 may be lower than, or equal to the upper surface of the second field insulating film 120.

While FIG. 13 illustrates the third field insulating film 150, in a semiconductor device according to some exemplary implementations, the third field insulating film 150 may not exist and the first field insulating film 110 and the second field insulating film 120 may fill the deep trench DT.

The first gate electrode 201 may include a first metal layer 211 and a second metal layer 221. Alternatively, the first gate electrode 201 may be in such a form in which two or more metal layers are stacked on one another. The first metal layer 211 plays a role of adjusting work function, and the second metal layer 221 plays a role of filling the space formed by the first metal layer 211. For example, the first metal layer 211 may include at least one of, for example, TiN, WN, TiAl, TiAlN, TaN, TiC, TaC, TaCN, TaSiN and a combination thereof, but not limited thereto. Further, the second metal layer 221 may include at least one of, for example, W, Al, Cu, Co, Ti, Ta, poly-Si, SiGe and a metal alloy, but is not limited thereto.

The second gate electrode 202 may include a first metal layer 212 and a second metal layer 222. Alternatively, the second gate electrode 202 may be in such a form in which two or more metal layers are stacked on one another. The first metal layer 212 plays a role of adjusting work function, and the second metal layer 222 plays a role of filling the space formed by the first metal layer 212. For example, the first metal layer 212 may include at least one of, for example, TiN, WN, TiAl, TiAlN, TaN, TiC, TaC, TaCN, TaSiN and a combination thereof, but not limited thereto. Further, the second metal layer 222 may include at least one of, for example, W, Al, Cu, Co, Ti, Ta, poly-Si, SiGe and a metal alloy, but not limited thereto.

For example, the first gate electrode 201 and the second gate electrode 202 may be formed by replacement process (or gate last process), but not limited thereto.

The first gate insulating films 130, 141 may be formed between the first and the second fin-type patterns F1, F2 and the first gate electrode 201, between the second field insulating film 120 and the first gate electrode 201, and between the third field insulating film 150 and the first gate electrode 201. The first gate insulating films 130, 141 may include an interfacial film 130 and a first high-k dielectric film 141.

The second gate insulating film 142 may be formed between the third fin-type pattern F3 and the second gate electrode 202, and between the third field insulating film 150 and the second gate electrode 202. The second gate insulating film 142 may include an interfacial film 130 and a second high-k dielectric film 142.

The first gate electrode 201 and the second gate electrode 202 may extend in the first direction X1, respectively. The first gate electrode 201 and the second gate electrode 202 may be spaced apart from each other in the first direction X1. One end of the first gate electrode 201 and one end of the second gate electrode may be opposed to each other in the first direction X1. In this case, the first gate insulating films 130, 140 overlap with the first gate electrode 201, and the second gate insulating film 142 overlaps with the second gate electrode 202. Accordingly, the first gate insulating films 130, 140 and the second gate insulating film 142 may also be spaced apart from each other in the first direction.

An interlayer insulating film 190 may be formed between the first gate electrode 201 and the second gate electrode 202. For example, the interlayer insulating film 190 may include at least one of silicon oxide, silicon nitride, silicon oxynitride, and a low-k dielectric material with a smaller dielectric constant than silicon oxide.

The first gate electrode 201 and the second gate electrode 202 have to be isolated electrically from each other. Accordingly, the interlayer insulating film 190 may be formed between the first gate electrode 201 and the second gate electrode 202 to electrically isolate the first gate electrode 201 and the second gate electrode 202 from each other.

Further, the first gate electrode 201 and the second gate electrode 202 have to be spaced apart from each other by a predetermined gap G1 in compliance with the design rule as restricted by the manufacturing process. That is, in a semiconductor device according to some exemplary implementations, the spacing margin has to be ensured between the first gate electrode 201 and the second gate electrode 202.

Note that reducing the end of the first gate electrode 201 to the direction of the second fin-type pattern F2 to ensure the margin of the first gate electrode 201 and the second gate electrode 202 can be accompanied with the problem of non-overlapping between the second fin-type pattern F2 and the first gate electrode 201. Accordingly, a gap G2 may be contemplated for an overlapping margin between the first gate electrode 201 and the second fin-type pattern F2.

In a semiconductor device according to an exemplary implementation the second fin-type pattern F2 may be inclined to ensure the gap G2 for the overlapping margin between the first gate electrode 201 and the second fin-type pattern F2. The second fin-type pattern F2 may be inclined to a direction farther away from one end of the first gate electrode 201. The second fin-type pattern F2 may be formed such that the width a5 from the center line of the second fin-type pattern F2 to the first side surface closer to the second shallow trench ST2 is larger than the width a6 from the center line to the second side surface closer to the third shallow trench ST3. The center line may be the center line of the width of the second fin-type pattern F2 on a contact surface between the second fin-type pattern F2 and the substrate 100.

As a result, the first gate electrode 201 can satisfy both the overlapping margin G2 with the second fin-type pattern F2 and the spacing margin with the second gate electrode 202.

Hereinbelow, a semiconductor device according to yet another exemplary implementation will be described with reference to FIGS. 12 and 14. Elements or operations overlapping with those described above with reference to FIGS. 1 to 13 will be mentioned as briefly as possible or omitted for the sake of brevity.

Figure 14:
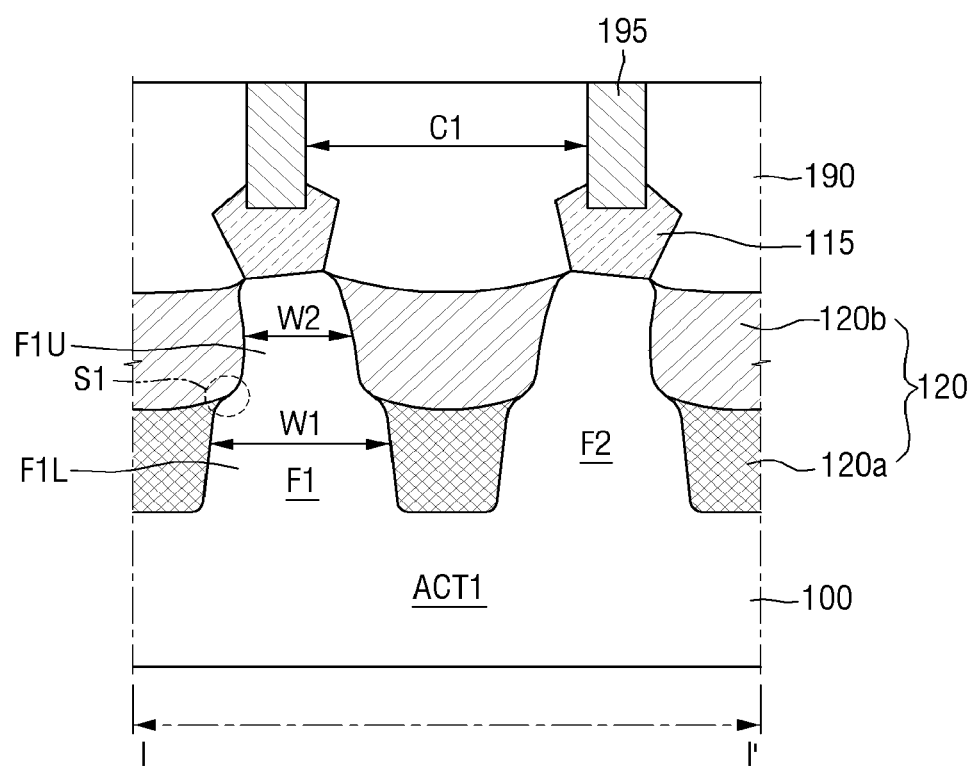
FIG. 14 is a cross sectional view taken on line F-F' of FIG. 12.

FIG. 14 is a cross sectional view taken on line F-F' of FIG. 12.

As shown in FIGS. 12 and 14, the semiconductor device according to an exemplary embodiment additionally includes a contact 195.

The contact 195 may be formed on the source/drain 115. The contact 195 may be formed by passing through the interlayer insulating film 190. A lower portion of the contact 195 may be inserted into the source/drain 115. However, exemplary embodiments are not limited to the example given above. The contact 195 may be electrically connected with the source/drain 115. The contact 195 may include a plurality of contacts. The source/drain 115 on the first fin-type pattern F1 and the source/drain 115 on the second fin-type pattern F2 may be connected one-to-one, respectively.

The plurality of contacts 195 should not be contacted with each other, but electrically isolated. Further, considering the gradually narrowing gaps among the plurality of contacts 195 according to miniaturization of the semiconductor device, the spacing margin has to be ensured among the plurality of contacts 195. According to an exemplary implementation, the semiconductor device can ensure an increased gap between the source/drains 115, as the adjacent fin-type patterns (i.e., the first fin-type pattern F1 and the second fin-type pattern F2) are inclined to opposite directions to each other. Further, a larger gap C1 may be ensured among the contacts 195 formed on the respective source/drains 115. Accordingly, an electrical short among the plurality of contacts 195 can be prevented and reliability of the semiconductor device can be increased.

Figure 15:
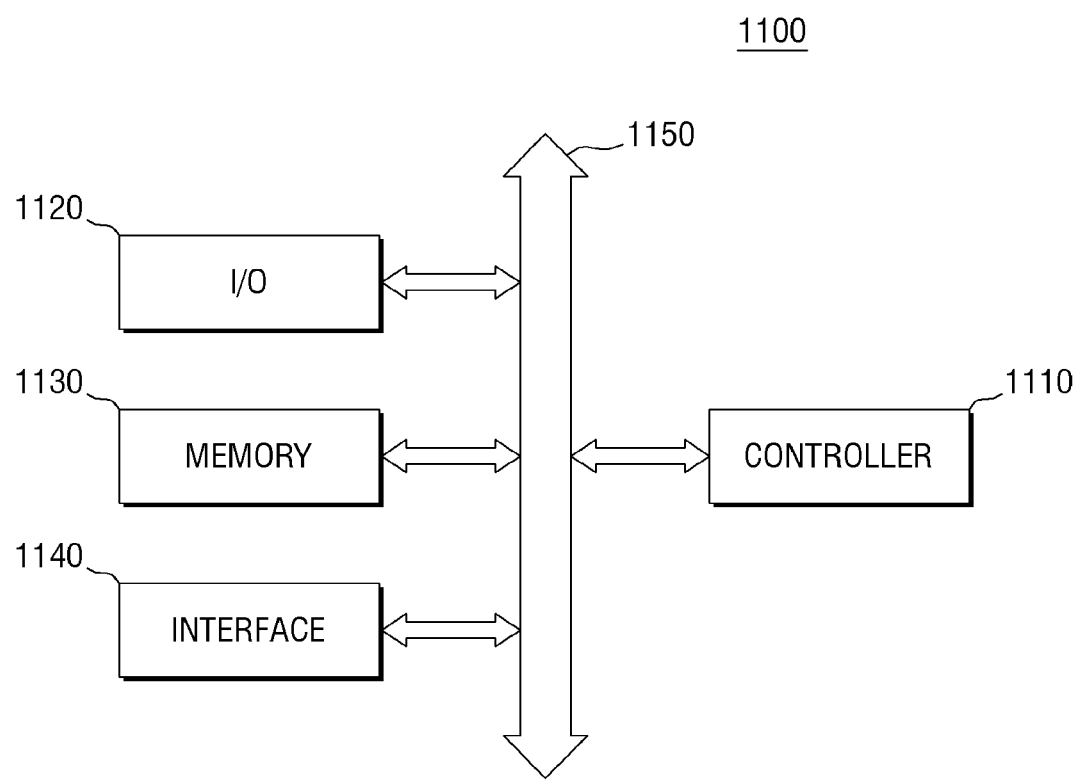
FIG. 15 is a block diagram of an electronic system comprising a semiconductor device according to some exemplary implementations.

FIG. 15 is a block diagram of an electronic system comprising a semiconductor device according to exemplary implementations.

Referring to FIG. 15, the electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, digital signal processor, micro controller or logic devices capable of performing functions similar to the functions of those mentioned above. The I/O device 1120 may include a keypad, a keyboard, a display device and so on. The memory device 1130 may store data and/or commands. The interface 1140 may perform a function of transmitting or receiving data to or from communication networks. The interface 1140 may be in a wired or wireless form. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

According to the exemplary embodiments described above, the semiconductor device may be provided within the memory device 1130, or provided as a part of the controller 1110, the I/O device 1120, and so on.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate;
a first fin disposed on the substrate;
a second fin disposed on the substrate;
a first source/drain disposed on the first fin and including a first epitaxial layer; and
a second source/drain disposed on the second fin and including a second epitaxial layer,
wherein the first epitaxial layer contacts the second epitaxial layer to form an air gap,
a first side surface of a lower portion of the first epitaxial layer has a first slope,
a second side surface of the lower portion of the first epitaxial layer has a second slope that is different from the first slope,
a first side surface of a lower portion of the second epitaxial layer has a third slope, and
a second side surface of the lower portion of the second epitaxial layer has a fourth slope that is different from the third slope.

2. The semiconductor device of claim 1, wherein the first source/drain and the second source/drain are bent to contact each other.

3. The semiconductor device of claim 1, wherein the air gap is formed underneath a portion where the first epitaxial layer and the second epitaxial layer are merged.

4. The semiconductor device of claim 1, wherein the first source/drain is vertically asymmetric, and
the second source/drain is vertically asymmetric.

5. The semiconductor device of claim 1, wherein a first end of a bottom surface of the first source/drain is disposed higher than a second end of the bottom surface of the first source/drain, the bottom surface of the first source/drain contacting the first fin.

6. The semiconductor device of claim 1, wherein an upper surface of the first fin is horizontally inclined.

7. The semiconductor device of claim 1, wherein the first fin and the second fin operate as one single device.

8. The semiconductor device of claim 1, wherein the first fin and the second fin are inclined.

9. A semiconductor device comprising:
a substrate;
a first fin disposed on the substrate;
a second fin disposed on the substrate;
a first source/drain disposed on the first fin; and
a second source/drain disposed on the second fin,
wherein the first source/drain and the second source/drain are bent to contact each other, and
an air gap is formed by the first source/drain and the second source/drain.

10. The semiconductor device of claim 9, wherein a first side surface of a lower portion of the first source/drain has a first slope,
a second side surface of the lower portion of the first source/drain has a second slope that is different from the first slope,
a first side surface of a lower portion of the second source/drain has a third slope, and
a second side surface of the lower portion of the second source/drain has a fourth slope that is different from the third slope.

11. The semiconductor device of claim 9, wherein the first source/drain is vertically asymmetric, and
the second source/drain is vertically asymmetric.

12. The semiconductor device of claim 9, wherein a first end of a bottom surface of the first source/drain is disposed higher than a second end of the bottom surface of the first source/drain, the bottom surface of the first source/drain contacting the first fin.

13. The semiconductor device of claim 9, further comprising a field insulating film disposed between the first fin and the second fin,
wherein the air gap is formed between the field insulating film, the first source/drain and the second source/drain.

14. The semiconductor device of claim 9, wherein an upper surface of the first fin is horizontally inclined.

15. A semiconductor device comprising:
a substrate;
a first fin disposed on the substrate;
a second fin disposed on the substrate;
a first source/drain disposed on the first fin; and
a second source/drain disposed on the second fin,
wherein the first source/drain is vertically asymmetric,
the second source/drain is vertically asymmetric,
the first source/drain contacts the second source/drain, and
a first end of a bottom surface of the first source/drain is disposed higher than a second end of the bottom surface of the first source/drain, the bottom surface of the first source/drain contacting the first fin.

16. The semiconductor device of claim 15, wherein a first side surface of a lower portion of the first source/drain has a first slope, and
a second side surface of the lower portion of the first source/drain has a second slope that is different from the first slope.

17. The semiconductor device of claim 15, wherein the first source/drain and the second source/drain are bent to be merged together.

18. The semiconductor device of claim 15, wherein an air gap is formed underneath a portion where the first source/drain and the second source/drain are merged.

19. The semiconductor device of claim 15, wherein a bottom surface of the second source/drain is inclined.

20. The semiconductor device of claim 15, wherein an upper surface of the first fin is horizontally inclined.

* * * * *